(12) United States Patent
Endo

(10) Patent No.: US 11,287,487 B2
(45) Date of Patent: Mar. 29, 2022

(54) MAGNETIC SENSOR, MEASURING DEVICE AND METHOD OF MANUFACTURING MAGNETIC SENSOR

(71) Applicant: SHOWA DENKO K.K., Tokyo (JP)

(72) Inventor: Daizo Endo, Ichihara (JP)

(73) Assignee: SHOWA DENKO K.K., Tokyo (JP)

( * ) Notice: Subject to any disclaimer, the term of this patent is extended or adjusted under 35 U.S.C. 154(b) by 48 days.

(21) Appl. No.: 16/767,783

(22) PCT Filed: Oct. 25, 2018

(86) PCT No.: PCT/JP2018/039715
§ 371 (c)(1),
(2) Date: May 28, 2020

(87) PCT Pub. No.: WO2019/107029
PCT Pub. Date: Jun. 6, 2019

(65) Prior Publication Data
US 2020/0341077 A1 Oct. 29, 2020

(30) Foreign Application Priority Data
Dec. 1, 2017 (JP) .............................. JP2017-231950

(51) Int. Cl.
*G01R 33/06* (2006.01)
*G01D 5/245* (2006.01)

(52) U.S. Cl.
CPC ........... *G01R 33/063* (2013.01); *G01D 5/245* (2013.01)

(58) Field of Classification Search
CPC ...... G01R 33/063; G01R 33/06; G01R 33/00; G01R 33/0011; G01R 33/02; G01R 33/09;
(Continued)

(56) References Cited

U.S. PATENT DOCUMENTS 6,236,200 B1 5/2001 Nekado et al.
7,268,539 B2 * 9/2007 Sato ................. G01D 5/147
324/207.25
(Continued)

FOREIGN PATENT DOCUMENTS

EP 3 640 659 A1 4/2020
EP 3 690 465 A1 8/2020
(Continued)

OTHER PUBLICATIONS

International Search Report for PCT/JP2018/039715 dated Jan. 8, 2019 [PCT/ISA/210].
(Continued)

*Primary Examiner* — Son T Le
(74) *Attorney, Agent, or Firm* — Sughrue Mion, PLLC

(57) ABSTRACT

A magnetic sensor 1 includes: a thin film magnet 20 which is constituted by a hard magnetic material layer 103 and has magnetic anisotropy in an in-plane direction; and a sensitive part 30 including a sensitive element 31 sensing a magnetic field by a magnetic impedance effect, the sensitive element 31 being constituted by a soft magnetic material layer 105 laminated on the hard magnetic material layer 103, having a longitudinal direction and a short direction, and having uniaxial magnetic anisotropy in a direction intersecting the longitudinal direction, in which the longitudinal direction faces in the direction of a magnetic field generated by the thin film magnet 20. The thin film magnet 20 and the sensitive element 31 are provided to constitute a magnetic circuit with a facing member provided outside to face one of magnetic poles of the thin film magnet 20.

6 Claims, 11 Drawing Sheets

(58) Field of Classification Search
CPC .... G01R 33/091; G01R 33/093; G01D 5/245; G01D 5/145; H01L 43/00; G01P 3/488
See application file for complete search history.

(56) References Cited

U.S. PATENT DOCUMENTS

| | | |
|---|---|---|
| 2004/0131887 A1 | 7/2004 | Ao et al. |
| 2007/0108970 A1 | 5/2007 | Ao et al. |
| 2007/0230052 A1* | 10/2007 | Ajan .................. G11B 5/66 360/131 |
| 2008/0145956 A1 | 6/2008 | Ao et al. |
| 2010/0045285 A1* | 2/2010 | Ohmori ............. G01R 33/1269 324/260 |
| 2020/0264243 A1 | 8/2020 | Endo |
| 2021/0141035 A1 | 5/2021 | Endo |

FOREIGN PATENT DOCUMENTS

| | | |
|---|---|---|
| JP | 10-247607 A | 9/1998 |
| JP | 11-183195 A | 7/1999 |
| JP | 2002-176210 A | 6/2002 |
| JP | 2004-271235 A | 9/2004 |
| JP | 2008-197089 A | 8/2008 |
| JP | 2008-249406 A | 10/2008 |

OTHER PUBLICATIONS

Extended European Search Report dated Jul. 23, 2021, issued by the European Patent Office in application No. 18884689.3.

* cited by examiner

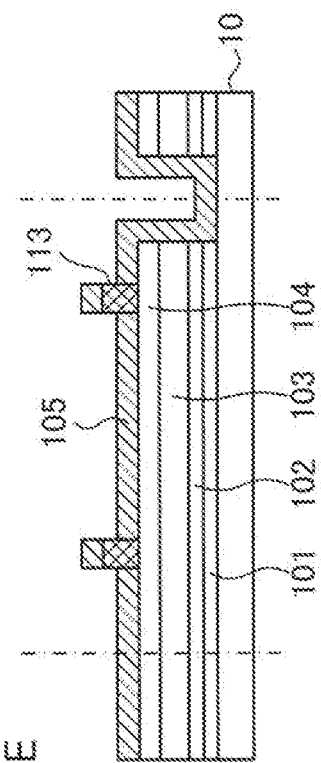
FIG.9A
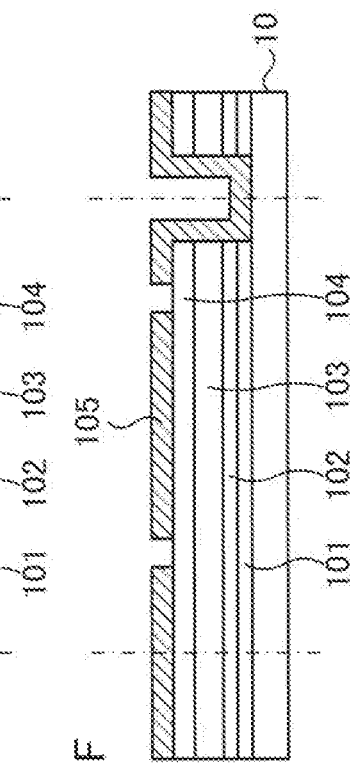
FIG.9B
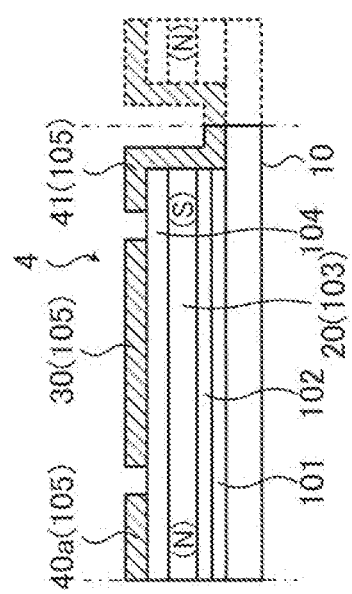
FIG.9C
FIG.9D
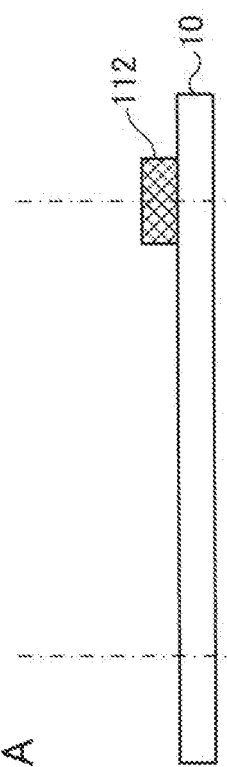
FIG.9E
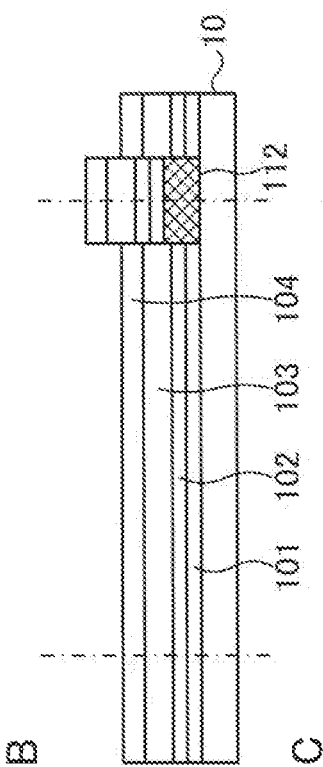
FIG.9F
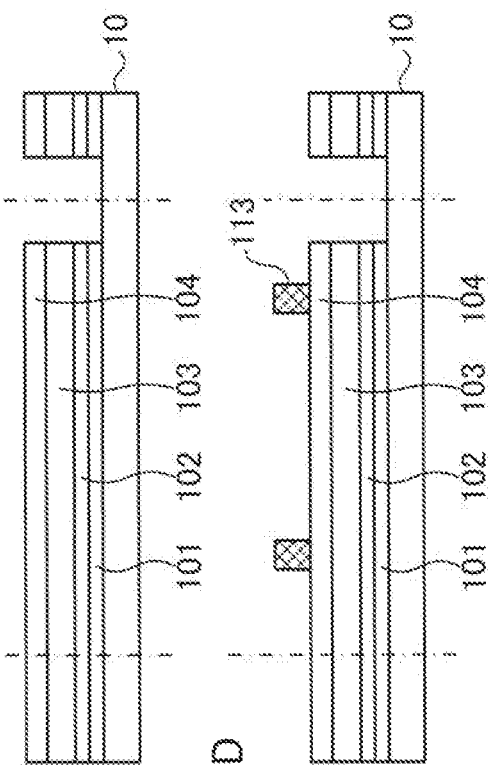
FIG.9G

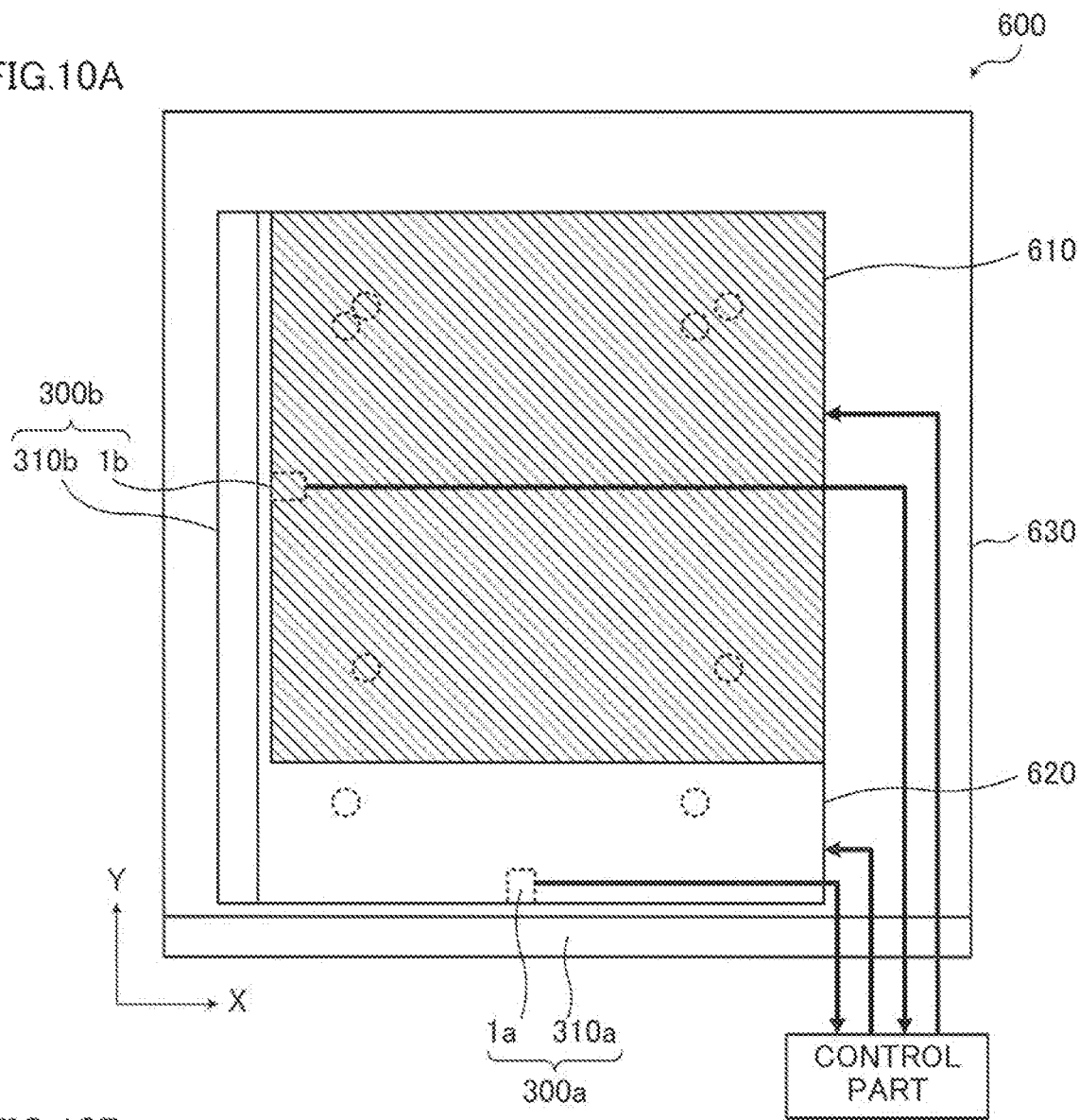
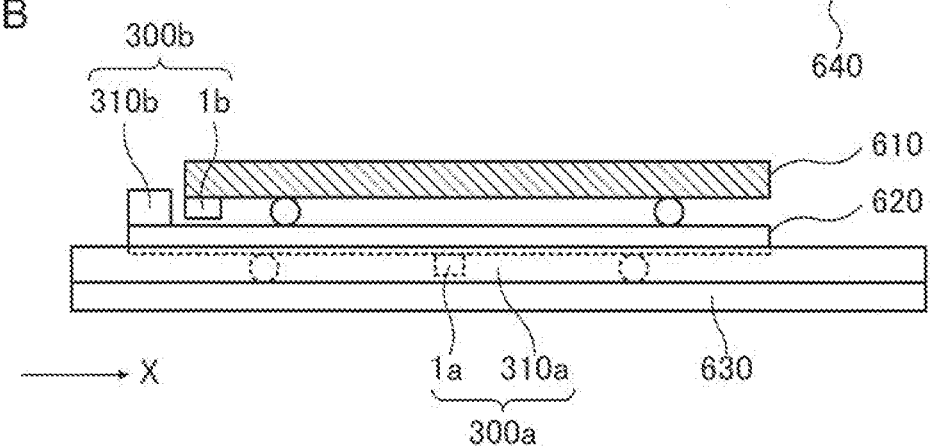

MAGNETIC SENSOR, MEASURING DEVICE AND METHOD OF MANUFACTURING MAGNETIC SENSOR

CROSS REFERENCE TO RELATED APPLICATIONS

This application is a National Stage of International Application No. PCT/JP2018/039715 filed Oct. 25, 2018, claiming priority based on Japanese Patent Application No. 2017-231950 filed Dec. 1, 2017.

TECHNICAL FIELD

The present invention relates to a magnetic sensor, a measuring device and a method of manufacturing the magnetic sensor.

BACKGROUND ART

As a conventional art described in a gazette, there exists a magnetic impedance effect element provided with a thin-film magnet composed of a hard magnetic substance film formed on a nonmagnetic substrate, an insulating layer covering the upside of the thin-film magnet, a magneto-sensitive part composed of one or plural rectangular soft magnetic substance films formed on the insulating layer and imparted with uniaxial anisotropy, and a conductor film for connecting the plural soft magnetic substance films of the magneto-sensitive part electrically. In a longitudinal direction of the magneto-sensitive part, both ends of the thin-film magnet are located outside both ends of the magneto-sensitive part. The insulating layer has openings above the respective ends of the thin-film magnet. On the insulating layer, a yoke section composed of a soft magnetic substance film is formed ranging from the ends of the thin-film magnet over to the vicinities of the ends of the magneto-sensitive part via the openings of the insulating layer (refer to Patent Document 1).

CITATION LIST

Patent Literature

Patent Document 1: Japanese Patent Application Laid-Open Publication No. 2008-249406

SUMMARY OF INVENTION

Technical Problem

By the way, in some cases, a magnetic sensor is combined with a facing member that is provided to face the magnetic sensor and moves relative to the magnetic sensor, to be thereby used for measuring a position or an angle from a relative moving amount of the facing member. In such cases, use of a sensor utilizing a magneto-impedance effect makes it possible to measure a relative moving amount of the facing member with high sensitivity as compared to use of a sensor utilizing the Hall effect or a magneto-resistive effect.

The present invention provides a magnetic sensor and the like utilizing the magneto-impedance effect capable of easily measuring a moving amount of a facing member that relatively moves, as compared to a case in which a thin film magnet is not included in a magnetic circuit with a facing member.

Solution to Problem

A magnetic sensor to which the present invention is applied includes: a thin film magnet configured with a hard magnetic material layer and having magnetic anisotropy in an in-plane direction; and a sensitive part provided with a sensitive element sensing a magnetic field by a magneto-impedance effect, the sensitive element being configured with a soft magnetic material layer laminated on the hard magnetic material layer, having a longitudinal direction and a short direction and having uniaxial magnetic anisotropy in a direction intersecting the longitudinal direction, the longitudinal direction facing in a direction of a magnetic field generated by the thin film magnet, wherein the thin film magnet and the sensitive element are provided to constitute a magnetic circuit with a facing member provided outside to face one of magnetic poles of the thin film magnet.

In the magnetic sensor like this, the magnetic pole of the thin film magnet facing the facing member is magnetically exposed toward the facing member.

With this, it is possible to constitute a magnetic circuit with ease by the thin film magnet and the sensitive element of the magnetic sensor and the facing member.

Moreover, in the magnetic sensor like this, the sensitive element of the sensitive part is configured with plural soft magnetic material layers that are antiferromagnetically-coupled with a demagnetizing field suppressing layer made of Ru or an Ru alloy interposed therebetween.

With this, the sensitivity of the sensitive element is improved.

Moreover, from another standpoint, a measuring device to which the present invention is applied includes: a magnetic sensor including a thin film magnet configured with a hard magnetic material layer and having magnetic anisotropy in an in-plane direction and a sensitive part provided with a sensitive element sensing a magnetic field by a magneto-impedance effect, the sensitive element being configured with a soft magnetic material layer laminated on the hard magnetic material layer, having a longitudinal direction and a short direction and having uniaxial magnetic anisotropy in a direction intersecting the longitudinal direction, the longitudinal direction facing in a direction of a magnetic field generated by the thin film magnet; and a facing member provided to face one of magnetic poles of the thin film magnet of the magnetic sensor, the facing member constituting a magnetic circuit with the thin film magnet and the sensitive element, wherein a variation in the magnetic field caused by relative movement of the facing member with respect to the magnetic sensor is measured by the sensitive element.

Further, from still another standpoint, a method of manufacturing a magnetic sensor includes: a hard magnetic material layer formation process forming a hard magnetic material layer constituting a thin film magnet on a nonmagnetic substrate, magnetic anisotropy of the thin film magnet being controlled in an in-plane direction; a sensitive part formation process laminating a soft magnetic material layer on the hard magnetic material layer to form a sensitive part including a sensitive element having uniaxial magnetic anisotropy in a direction intersecting a direction of a magnetic field generated by the thin film magnet and sensing a magnetic field by a magneto-impedance effect; and a thin film magnet processing process processing the hard magnetic material layer into the thin film magnet to cause one of magnetic poles of the thin film magnet to be magnetically exposed toward a facing member provided outside to face the one of the magnetic poles of the thin film magnet.

The method of manufacturing a magnetic sensor like this further includes a control layer formation process forming a control layer between the nonmagnetic substrate and the hard magnetic material layer, the control layer controlling the magnetic anisotropy of the hard magnetic material layer in an in-plane direction.

With this, it becomes easy to control an in-plane anisotropy of the hard magnetic material layer.

Advantageous Effects of Invention

According to the present invention, it is possible to provide a magnetic sensor and the like utilizing the magneto-impedance effect capable of easily measuring a moving amount of a facing member that relatively moves, as compared to a case in which a thin film magnet is not included in a magnetic circuit with a facing member.

BRIEF DESCRIPTION OF DRAWINGS

FIG. 2A is a plan view and FIG. 2B is a cross-sectional view along the IIB-IIB line in FIG. 2A;

FIG. 4A is a diagram showing a relationship between a gear and the magnetic sensor in the measuring device, and FIG. 4B shows time variation of the impedance of the sensitive part in the magnetic sensor;

FIGS. 5A to 5E show respective processes in the method of manufacturing the magnetic sensor;

FIG. 6A is a plan view and FIG. 6B is a cross-sectional view along the VIB-VIB line in FIG. 6A;

FIG. 7A is a plan view and FIG. 7B is a cross-sectional view along the VIIB-VIIB line in FIG. 7A;

FIG. 8A is a plan view and FIG. 8B is a cross-sectional view along the VIIIB-VIIIB line in FIG. 8A;

FIGS. 9A to 9G shows diagrams illustrating an example of a method of manufacturing the still other magnetic sensor, which is the modified example, where FIGS. 9A to 9G show respective processes in the method of manufacturing the magnetic sensor;

FIGS. 10A and 10B shows diagrams illustrating an XY stage by use of an example of a measuring device to which a second exemplary embodiment is applied, where FIG. 10A is a plan view and FIG. 10B is a side elevational view.

DESCRIPTION OF EMBODIMENTS

The magnetic sensor to be described in the present specification uses a so-called magneto-impedance effect. The magnetic sensor using the magneto-impedance effect has high sensitivity as compared to sensors using the Hall effect or the magneto-resistive effect. Consequently, use of the magneto-impedance effect in the magnetic sensor is likely to improve measurement accuracy.

Hereinafter, exemplary embodiments according to the present invention will be described in detail with reference to attached drawings.

First Exemplary Embodiment

Figure 1:
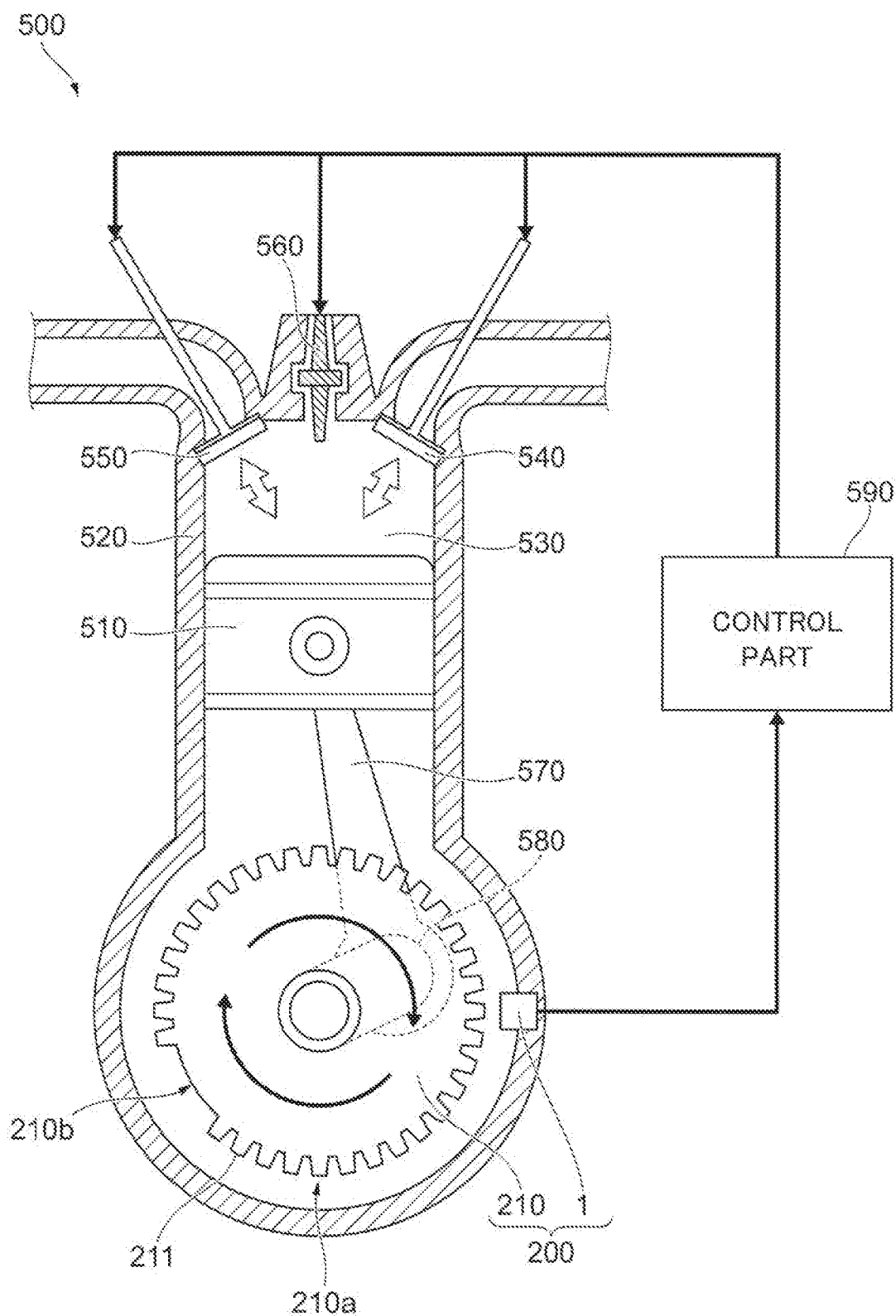
FIG. 1 shows a diagram illustrating a vehicle engine using an example of a measuring device to which a first exemplary embodiment is applied.

FIG. 1 shows a diagram illustrating a vehicle engine 500 using an example of a measuring device 200 to which a first exemplary embodiment is applied. The measuring device 200 shown here measures an angle. Here, as an example of measurement of an angle, description will be given of a case in which a crank angle of the vehicle engine 500 is measured.

The vehicle engine 500 includes a piston 510 and a cylinder 520 inside which the piston 510 performs reciprocating motion. Space surrounded by the piston 510 and the cylinder 520 constitutes combustion space 530. Moreover, the vehicle engine 500 includes: an intake valve 540 breathing gas containing fuel into the inside of the combustion space 530; an exhaust valve 550 exhausting burned gas; and a spark plug 560 igniting the fuel. In other words, the intake valve 540, the exhaust valve 550 and the spark plug 560 are provided at a portion constituting the combustion space 530 of the cylinder 520.

The vehicle engine 500 is connected to the piston 510 and includes a con' rod (connecting rod) 570 converting the reciprocating motion of the piston 510 into rotary motion. Further, the vehicle engine 500 includes a crank (crank shaft) 580 to which the con' rod 570 is connected, the crank 580 rotating with the reciprocating motion of the piston 510.

When a rotation axis of the crank 580 is viewed from the lateral direction, the crank 580 includes a portion projecting into a U shape. The con' rod 570 is rotatably connected to the portion projecting into the U shape. Note that the vehicle engine 500 includes plural pistons 510, plural portions projecting into the U shape are provided along the rotation axis, the number of portions corresponding to the number of pistons 510. The portions projecting into the U shape are disposed around the rotation axis at an angle set in accordance with the number of pistons 510.

The measuring device 200 measures the angle (rotation angle) of the crank 580 in the vehicle engine 500. The measuring device 200 includes: a disk-shaped gear 210 connected to the crank 580 and rotating with the rotation of the crank 580; and the magnetic sensor 1 provided in proximity to the outer circumference of the gear 210. The gear 210 is provided with teeth 211 projecting outwardly along the outer circumference at determined intervals. Note that a portion of the outer circumference of the gear 210 is a non-teeth part 210$b$ where the teeth 211 are not provided. A portion of the outer circumference of the gear 210 where the teeth 211 are provided is a teeth part 210$a$. Note that the gear 210 is an example of a facing member.

Then, the vehicle engine 500 includes a control part 590 controlling the timing to open and close the intake valve 540 and the exhaust valve 550 and the timing to ignite the spark plug 560 based on the rotation angle of the crank 580 measured by the measuring device 200.

First, an overview of operation of the vehicle engine 500 will be described.

In FIG. 1, it is assumed that the piston 510 is positioned at the uppermost portion in FIG. 1. In other words, the combustion space 530 formed by the piston 510 and the cylinder 520 is in the narrowest state (smallest in volume). From the rotation angle of the crank 580 measured by the measuring device 200, the control part 590 senses that the piston 510 is positioned at the uppermost portion. Then, the control part 590 opens the intake valve 540. Next, with descent of the piston 510, the gas containing the fuel is sucked into the combustion space 530 via the intake valve 540. Next, from the rotation angle of the crank 580 measured by the measuring device 200, the control part 590 senses that the piston 510 has come down to the lowermost portion. Then, the control part 590 closes the intake valve 540.

Next, upward movement of the piston 510 toward the uppermost portion compresses the gas containing the fuel sucked into the combustion space 530. From the rotation angle of the crank 580 measured by the measuring device 200, the control part 590 senses that the piston 510 has reached the uppermost portion. Then, the control part 590 ignites the spark plug 560 (causes the spark plug to spark), to thereby ignite the fuel of the compressed gas and burn the fuel. This pushes the piston 510 downward. From the rotation angle of the crank 580 measured by the measuring device 200, the control part 590 senses that the piston 510 has reached the lowermost portion. Then, the control part 590 opens the exhaust valve 550.

Next, upward movement of the piston 510 toward the uppermost portion discharges the gas containing the burned fuel in the combustion space 530 via the exhaust valve 550. From the rotation angle of the crank 580 measured by the measuring device 200, the control part 590 senses that the piston 510 has reached the uppermost portion. Then, the control part 590 closes the exhaust valve 550 and opens the intake valve 540 again.

Then, a series of operations described above is repeated.

As described above, in the vehicle engine 500, the control part 590 controls the timing to open and close the intake valve 540 and the exhaust valve 550 and the timing to ignite the spark plug 560 based on the rotation angle of the crank 580 measured by the measuring device 200. Note that, in the above, it was described that the intake valve 540 or the exhaust valve 550 was opened or closed or the spark plug 560 was ignited at the timing when the piston 510 reached the uppermost portion or the lowermost portion; however, these are merely an example, and other timings, such as timing deviated from these, may be adopted.

(Magnetic Sensor 1)

Next, the measuring device 200 measuring the rotation angle of the crank 580 will be described.

Figure 2A:
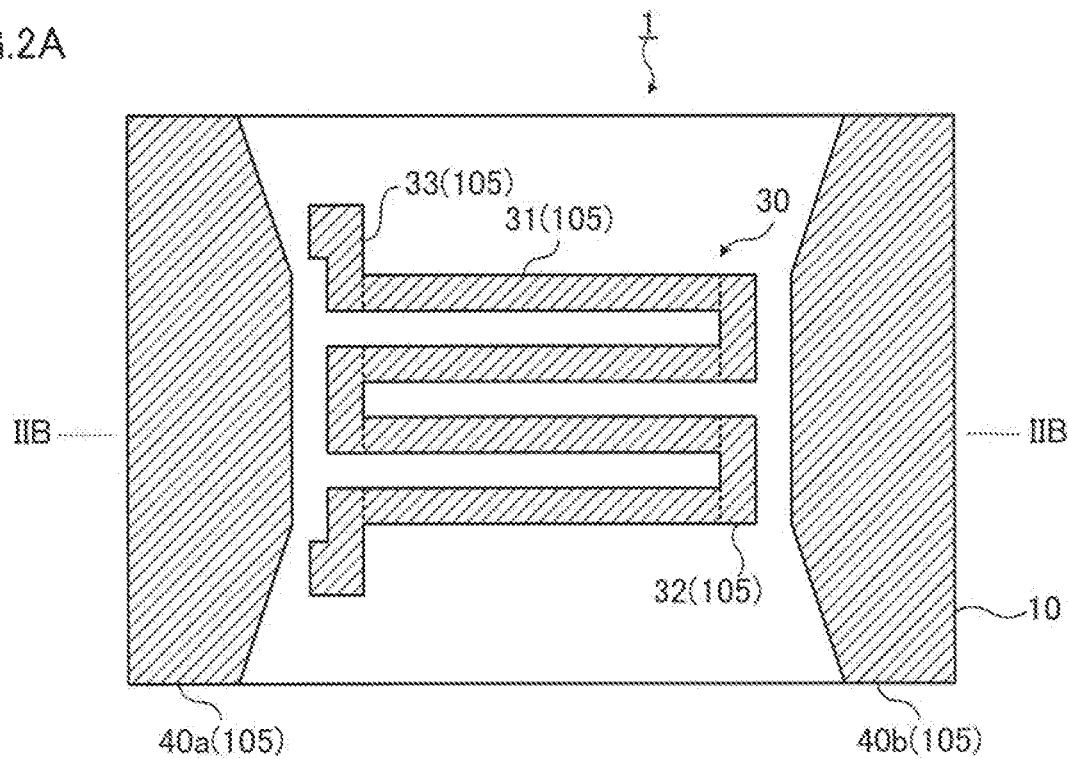
FIGS. 2A and 2B show diagrams illustrating an example of a magnetic sensor used in the measuring device to which the first exemplary embodiment is applied, where
Figure 2B:
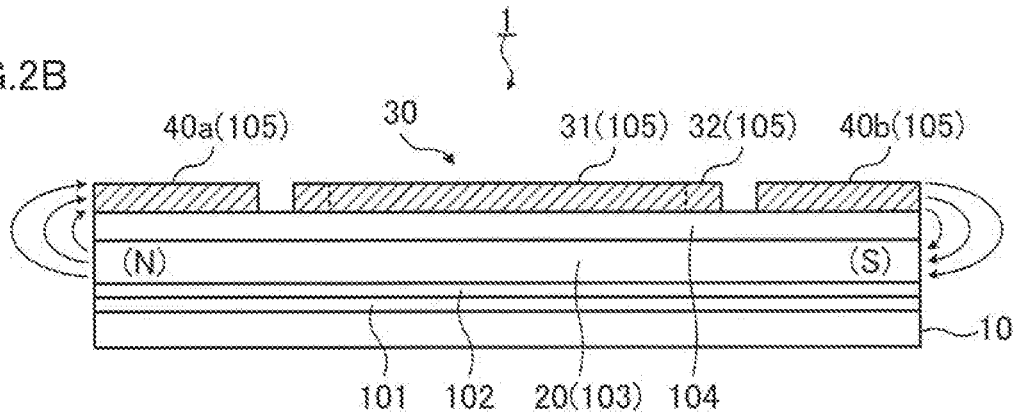

FIGS. 2A and 2B show diagrams illustrating an example of the magnetic sensor 1 used in the measuring device 200 to which the first exemplary embodiment is applied. FIG. 2A is a plan view and FIG. 2B is a cross-sectional view along the IIB-IIB line in FIG. 2A.

As shown in FIG. 2B, the magnetic sensor 1 to which the first exemplary embodiment is applied includes: a thin film magnet 20 configured with a hard magnetic material (a hard magnetic material layer 103) provided on a nonmagnetic substrate 10; and a sensitive part 30 laminated to face the thin film magnet 20 and configured with a soft magnetic material (the soft magnetic material layer 105) to sense a magnetic field. Note that a cross-sectional structure of the magnetic sensor 1 will be described in detail later.

Here, the hard magnetic material has a large, so-called coercive force, the hard magnetic material being once magnetized by an external magnetic field, even upon removal of the external magnetic field, maintaining the magnetized state. On the other hand, the soft magnetic material has a small, so-called coercive force, the soft magnetic material being easily magnetized by an external magnetic field, but, upon removal of the external magnetic field, quickly returning to a state with no magnetization or a little magnetization.

Note that, in the present specification, an element constituting the magnetic sensor 1 is indicated by a two-digit number, and a layer processed into an element (the hard magnetic material layer 103 or the like) is indicated by a number of one hundreds. Then, for a figure indicating an element, a figure indicating a layer processed into the element is written in parentheses. For example, the case of the thin film magnet 20 is written as thin film magnet 20 (hard magnetic material layer 103). In the figure, the case is written as 20 (103). The same is true in other cases.

Description will be given of a planar structure of the magnetic sensor 1 by FIG. 2A. The magnetic sensor 1 has a quadrangular planar shape as an example. Here, the sensitive part 30 and yokes 40 formed at the uppermost portion of the magnetic sensor 1 will be described. The sensitive part 30 includes: plural reed-shaped sensitive elements 31 each having a longitudinal direction and a short direction in a planar shape thereof; connection parts 32 windingly performing serial connection of the adjacent sensitive elements 31; and terminal parts 33 to which electric wires for supplying the electrical current are connected. Here, four sensitive elements 31 are arranged so that the longitudinal directions thereof are in parallel with one another. The sensitive element 31 serves as a magneto-impedance effect element.

The sensitive part 31 has, for example, the length in the longitudinal direction of about 1 mm, the width in the short direction of several tens of micrometers, and the thickness (the thickness of the soft magnetic material layer 105) of 0.5 µm to 5 µm. The intervals between the sensitive elements 31 are 50 µm to 100 µm.

The connection part 32 is provided between end portions of the adjacent sensitive elements 31 and windingly performs serial connection of the adjacent sensitive elements 31. In the magnetic sensor 1 shown in FIG. 2A, four sensitive elements 31 are disposed in parallel, and therefore there are three connection parts 32. The number of sensitive elements 31 is set in accordance with magnitude of the magnetic field to be sensed (measured) or an impedance Z of the sensitive part 30 to be described later. Consequently, if there are two sensitive parts 31, there is one connection part 32. Moreover, if there is one sensitive part 31, no connection part 32 is provided. Note that the width of the connection part 32 may be set in accordance with the electrical current to be applied to the sensitive part 30. For example, the width of the connection part 32 may be the same as that of the sensitive part 31.

The terminal parts 33 are provided to the (two) respective end portions of the sensitive parts 31, the end portions not being connected to the connection parts 32. The terminal part 33 includes a drawn-out part drawn out of the sensitive element 31 and a pad part connecting electric wires for supplying the electrical current. The drawn-out part is provided to dispose two pad parts in the short direction of the sensitive element 31. It may be possible to provide the pad part to be continuous with the sensitive element 31 without providing the drawn-out part. The pad part may have a size capable of connecting the electric wires. Note that, since there are four sensitive elements 31, the two terminal parts 33 are provided on the left side in FIG. 2A. In the case where the number of sensitive elements 31 is an odd number, two terminal parts 33 may be provided into right and left.

Then, the sensitive elements 31, the connection parts 32 and the terminal parts 33 of the sensitive part 30 are integrally configured with a single layer of the soft magnetic material layer 105. The soft magnetic material layer 105 has conductivity, and therefore, it is possible to apply the electrical current from one terminal part 33 to the other terminal part 33.

Note that the above-described numerical values, such as the length and the width of the sensitive element 31 and the number of sensitive elements to be disposed in parallel, are merely an example; the numerical values may be changed in accordance with the value of the magnetic field to be sensed (measured) or the soft magnetic material to be used.

Further, the magnetic sensor 1 includes yokes 40 each of which is provided to face the end portions of the sensitive elements 31 in the longitudinal direction thereof. Here, there are provided two yokes 40a and 40b, each of which is provided to face each of both end portions of the sensitive elements 31 in the longitudinal direction thereof. Note that, in the case where the yokes 40a and 40b are not distinguished, the yokes are referred to as a yoke 40. The yoke 40 guides lines of magnetic force to the end portion of the sensitive element 31 in the longitudinal direction thereof. Therefore, the yoke 40 is configured with a soft magnetic material (a soft magnetic material layer 105) through which the lines of magnetic force are likely to pass. In other words, the sensitive part 30 and the yokes 40 are formed of a single layer of the soft magnetic material layer 105. Note that, in the case where the lines of magnetic force sufficiently pass in the longitudinal direction of the sensitive element 31, it is unnecessary to provide the yokes 40.

From above, the size of the magnetic sensor 1 is several millimeters square in the planar shape. Note that the size of the magnetic sensor 1 may be other values.

Next, with reference to FIG. 2B, the cross-sectional structure of the magnetic sensor 1 will be described in detail. The magnetic sensor 1 is configured by disposing (laminating) an adhesive layer 101, a control layer 102, the hard magnetic material layer 103 (the thin film magnet 20), an insulating layer 104 and the soft magnetic material layer 105 (the sensitive part 30 and the yokes 40) in this order on a nonmagnetic substrate 10.

The substrate 10 is composed of a non-magnetic material; for example, an oxide substrate, such as glass or sapphire, or a semiconductor substrate, such as silicon, can be provided.

The adhesive layer 101 is a layer for improving adhesiveness of the control layer 102 to the substrate 10. As the adhesive layer 101, it is preferable to use an alloy containing Cr or Ni. Examples of the alloy containing Cr or Ni include CrTi, CrTa and NiTa. The thickness of the adhesive layer 101 is, for example, 5 nm 50 nm. Note that, if there is no problem in adhesiveness of the control layer 102 to the substrate 10, it is unnecessary to provide the adhesive layer 101. Note that, in the present specification, composition ratios of alloys containing Cr or Ni are not shown. The same applies hereinafter.

The control layer 102 controls the magnetic anisotropy of the thin film magnet 20 configured with the hard magnetic material layer 103 to be likely to express in the in-plane direction of the film. As the control layer 102, it is preferable to use Cr, Mo or W, or an alloy containing thereof (hereinafter, referred to as an alloy containing Cr or the like to constitute the control layer 102). Examples of the alloy containing Cr or the like to constitute the control layer 102 include CrTi, CrMo, CrV and CrW. The thickness of the control layer 102 is, for example, 5 nm 100 nm.

It is preferable that the hard magnetic material layer 103 constituting the thin film magnet 20 uses an alloy that contains Co as a main component and also contains at least one of Cr and Pt (hereinafter, referred to as a Co alloy constituting the thin film magnet 20). Examples of the Co alloy constituting the thin film magnet 20 include CoCrPt, CoCrTa, CoNiCr and CoCrPtB. Note that Fe may be contained. The thickness of the hard magnetic material layer 103 is, for example, 50 nm to 500 nm.

The alloy containing Cr or the like to constitute the control layer 102 has a bcc (body-centered cubic) structure. Consequently, the hard magnetic material constituting the thin film magnet 20 (the hard magnetic material layer 103) preferably has an hcp (hexagonal close-packed) structure easily causing crystal growth on the control layer 102 composed of the alloy containing Cr or the like having the bcc structure. When crystal growth of the hard magnetic material layer 103 having the hcp structure is caused on the bcc structure, the c-axis of the hcp structure is likely to be oriented in a plane. Therefore, the thin film magnet 20 configured with the hard magnetic material layer 103 is likely to have the magnetic anisotropy in the in-plane direction. Note that the hard magnetic material layer 103 is polycrystalline, and each crystal has the magnetic anisotropy in the in-plane direction. Consequently, the magnetic anisotropy is referred to as crystal magnetic anisotropy in some cases.

Note that, to promote the crystal growth of the alloy containing Cr or the like to constitute the control layer 102 and the Co alloy constituting the thin film magnet 20, the substrate 10 may be heated to 100° C. to 600° C. By the heating, the crystal growth of the alloy containing Cr or the like constituting the control layer 102 is likely to be caused, and thereby crystalline orientation is likely to be provided so that the hard magnetic material layer 103 having the hcp structure includes an axis of easy magnetization in a plane. In other words, the magnetic anisotropy is likely to be imparted in a plane of the hard magnetic material layer 103.

The insulating layer 104 is configured with nonmagnetic insulating material and electrically insulates the thin film magnet 20 and the sensitive part 30. Examples of the insulating material constituting the insulating layer 104 include oxide, such as $SiO_2$ or $Al_2O_3$, or nitride, such as $Si_3N_4$ or AlN. The thickness of the insulating layer 104 is, for example, 100 nm to 500 nm.

The sensitive element 31 in the sensitive part 30 is provided with uniaxial magnetic anisotropy in a direction crossing the longitudinal direction, for example, an intersecting short direction (the width direction). As the soft magnetic material constituting the sensitive element 31 (the soft magnetic material layer 105), it is preferable to use an amorphous alloy, which is an alloy containing Co as a main component doped with a high melting point metal, such as Nb, Ta or W (hereinafter, referred to as a Co alloy constituting the sensitive element 31). Examples of the Co alloy constituting the sensitive element 31 include CoNbZr, CoFeTa and CoWZr. The thickness of the soft magnetic material (the soft magnetic material layer 105) constituting the sensitive element 31 is, for example, 0.5 μm to 5 μm.

Note that the direction intersecting the longitudinal direction may have an angle exceeding 45°.

The adhesive layer 101, the control layer 102, the hard magnetic material layer 103 (the thin film magnet 20) and the insulating layer 104 are processed to have a quadrangular planar shape (refer to FIG. 2A). Then, of the exposed side surfaces, in the two facing side surfaces, the thin film magnet 20 serves as the north pole ((N) in FIG. 2B) and the south pole ((S) in FIG. 2B). Note that the line connecting the north pole and the south pole of the thin film magnet 20 takes the longitudinal direction of the sensitive element 31 in the sensitive part 30. Note that to take the longitudinal direction means that an angle formed by the line connecting the north pole and the south pole and the longitudinal direction is less than 45°. Note that the smaller the angle formed by the line connecting the north pole and the south pole and the longitudinal direction, the better.

As indicated by arrows in FIG. 2B, in the magnetic sensor 1, the lines of magnetic force coming out of the north pole of the thin film magnet 20 once go to the outside. Then, a part of the lines of magnetic force passes through the sensitive element 31 via the yoke 40a and goes to the outside again via the yoke 40b. The lines of magnetic force that have passed through the sensitive element 31 return to the south pole of the thin film magnet 20 together with the lines of magnetic force that have not passed through the sensitive element 31. In other words, the thin film magnet 20 applies the magnetic field to the longitudinal direction of the sensitive element 31.

Note that the north pole and the south pole of the thin film magnet 20 are collectively referred to as both magnetic poles, and when the north pole and the south pole are not distinguished, they are referred to as a magnetic pole.

Note that, as shown in FIG. 2A, the yoke 40 (the yokes 40a and 40b) is configured so that the shape thereof as viewed from the front surface side of the substrate 10 is narrowed as approaching the sensitive part 30. This is to concentrate the magnetic field to (to gather the lines of magnetic force on) the sensitive part 30. In other words, the magnetic field in the sensitive part 30 is strengthened to further improve the sensitivity. Note that the width of the portion of the yoke 40 (the yokes 40a and 40b) facing the sensitive part 30 may not be narrowed.

Here, the interval between the yoke 40 (the yokes 40a and 40b) and the sensitive parts 30 may be, for example, 1 μm to 100 μm.

Figure 3:
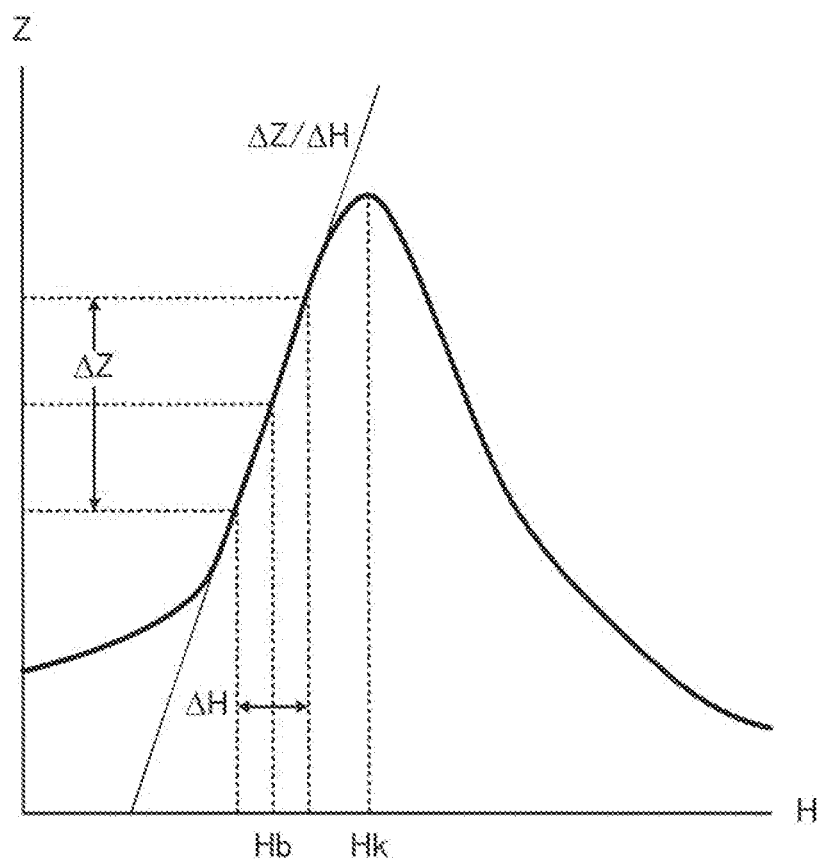
FIG. 3 is a diagram illustrating a relationship between a magnetic field applied in the longitudinal direction of a sensitive element in a sensitive part of the magnetic sensor and an impedance of the sensitive part.

FIG. 3 is a diagram illustrating a relationship between the magnetic field applied in the longitudinal direction of the sensitive element 31 in the sensitive part 30 of the magnetic sensor 1 and the impedance of the sensitive part 30. In FIG. 3, the horizontal axis indicates the magnetic field H and the vertical axis indicates the impedance Z. The impedance Z of the sensitive part 30 is measured by passing the electrical current between two terminal parts 33. When the measurement is performed with high-frequency current, variations ΔZ in the impedance Z caused by variations ΔH in the magnetic field H is increased by the skin effect.

As shown in FIG. 3, the impedance Z of the sensitive part 30 is increased as the magnetic field H applied to the longitudinal direction of the sensitive element 31 is increased. However, when the magnetic field H to be applied reaches an anisotropic magnetic field Hk of the sensitive element 31, the impedance Z leads up to the maximum value (peak). When the magnetic field H to be applied is further increased, the impedance Z is conversely decreased. Consequently, within the range in which the magnetic field H to be applied is smaller than the anisotropic magnetic field Hk, by use of a portion where the variations ΔZ in the impedance Z with respect to the variations ΔH in the magnetic field H is steep (ΔZ/ΔH is large), it is possible to extract extremely weak variations in the magnetic field H as the variations ΔZ in the impedance Z. In FIG. 3, the center of the magnetic field H where ΔZ/ΔH is large is shown as the magnetic field Hb. In other words, it is possible to measure the variations (ΔH) in the magnetic field H in the vicinity to the magnetic field Hb (the range indicated by arrows in FIG. 3) with high accuracy. The magnetic field Hb is referred to as a bias magnetic field in some cases.

Next, description will be given of a measuring method of an angle in the measuring device 200.

Figure 4A:
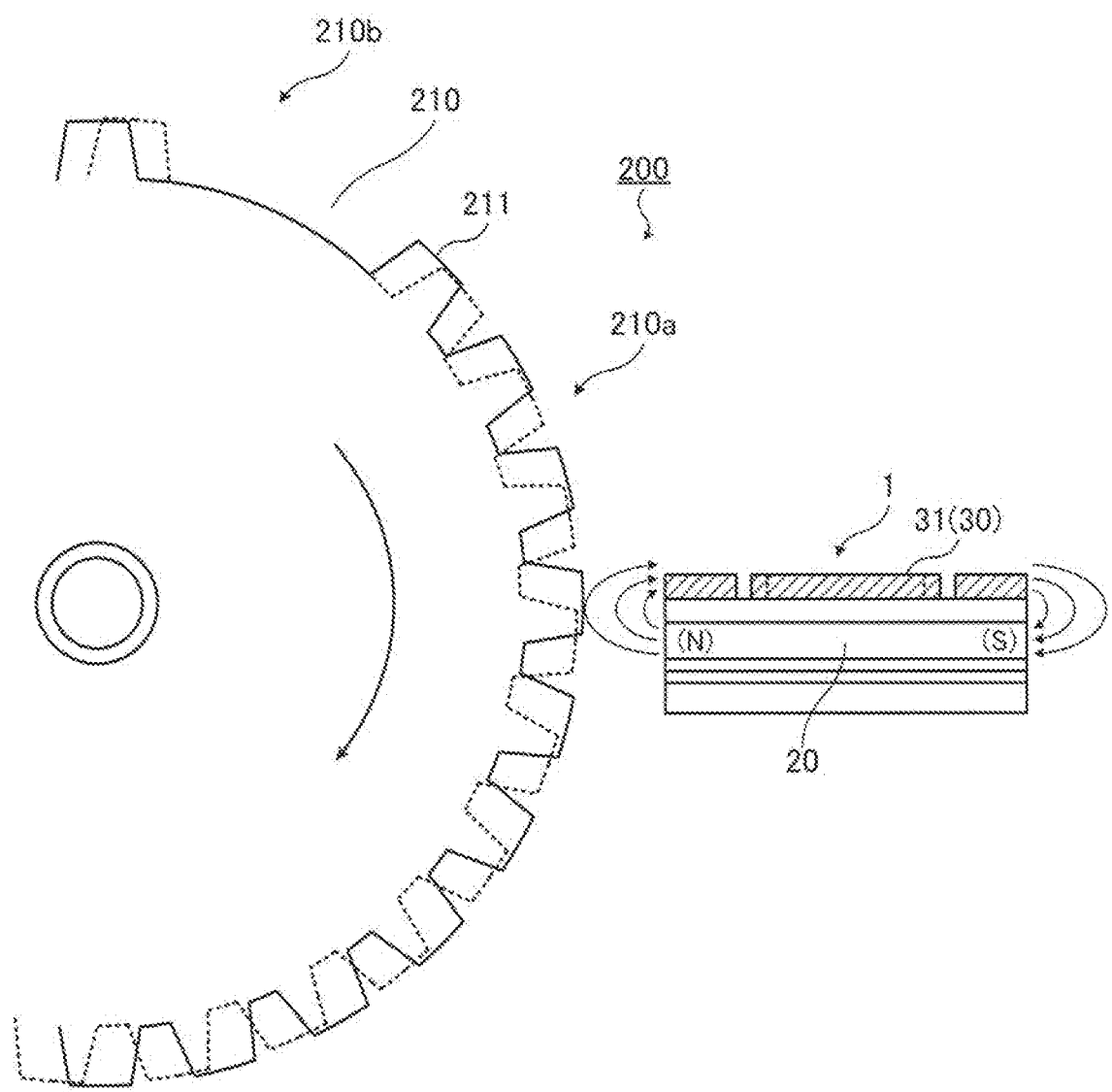
FIGS. 4A and 4B show diagrams illustrating a measuring method of an angle by the measuring device, where
Figure 4B:
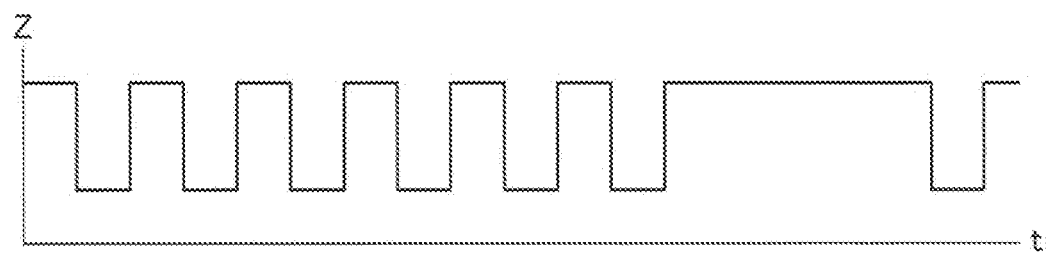

FIGS. 4A and 4B show diagrams illustrating a measuring method of an angle by the measuring device 200. FIG. 4A is a diagram showing a relationship between a gear 210 and the magnetic sensor 1 in the measuring device 200 and FIG. 4B shows time variation of the impedance Z of the sensitive part 30 in the magnetic sensor 1. In FIG. 4A, two states of the gear 210 are shown in a solid line and a broken line. In FIG. 4B, the vertical axis indicates the impedance Z, and the horizontal axis indicates the time t.

As shown in FIG. 4A, in the measuring device 200, the magnetic sensor 1 is disposed to face the outer circumferential part of the gear 210. In other words, the magnetic sensor 1 is disposed so that one of the magnetic poles of the thin film magnet 20, the north pole here, faces the outer circumferential part of the gear 210. The gear 210 is configured with a magnetic material through which the lines of magnetic force are likely to pass (for example, the soft magnetic material). Consequently, the thin film magnet 20 and the sensitive part 30 (the sensitive elements 31) in the magnetic sensor 1 and the gear 210 constitute a magnetic circuit. In other words, the lines of magnetic force coming out of the north pole of the thin film magnet 20 in the magnetic sensor 1 return to the south pole of the thin film magnet 20 via the gear 210 and the sensitive elements 31 of the sensitive part 30. Then, the distance (the gap) between the north pole of the thin film magnet 20 and the gear 210 differs between the case where, as indicated by the solid line, the north pole of the thin film magnet 20 approaches the tooth (one of the teeth) 211 (a peak) of the gear 210 and the case where, as indicated by the broken line, the north pole of the thin film magnet 20 approaches space between the teeth 211 (a trough) of the gear 210. Consequently, in the above-described two cases, the magnetic field H to be applied to the sensitive part 30 differs, and therefore, the impedance Z of the sensitive part 30 varies.

In other words, when the north pole of the thin film magnet 20 approaches the tooth (one of the teeth) 211 (the peak) of the gear 210, the lines of magnetic force from the thin film magnet 20 are likely to extend (to be absorbed) toward the tooth (one of the teeth) 211 (the peak); therefore, the lines of magnetic force returning to the sensitive part 30 are reduced. For this reason, the magnetic field to be applied to the sensitive part 30 is reduced, and thereby the impedance Z of the sensitive part 30 is reduced.

To the contrary, when the north pole of the thin film magnet 20 approaches the space between the teeth 211 (the trough) of the gear 210, the lines of magnetic force from the thin film magnet 20 are less likely to extend (to be absorbed) toward the gear 210; therefore, the lines of magnetic force returning to the sensitive part 30 are increased. For this reason, the magnetic field to be applied to the sensitive part 30 is increased, and thereby the impedance Z of the sensitive part 30 is increased.

Consequently, as shown in FIG. 4B, rotation of the gear 210 with the rotation of the crank 580 causes pulsed (rectangular-wave-shaped) variations of the impedance Z with respect to time t. Then, in the non-teeth part 210b of the gear 210, similar to the case of approaching the space between the teeth 211 (the trough), the state where the impedance Z is increased is brought about. Accordingly, in the case where the magnetic sensor 1 approaches the non-teeth part 210b, as compared to the case of approaching the space between the teeth 211 (the trough), the state of the large impedance Z continues. Therefore, according to the non-teeth part 210b as a reference, the angle (the rotation angle) of the crank 580 is measured by counting the pulses of the impedance Z.

As described above, the measuring device 200 modulates the magnetic field H to be applied to the sensitive part 30 by the thin film magnet 20 by alternately causing the tooth (one of the teeth) 211 (the peak) and the space between the teeth 211 (the trough) of the gear 210 formed of a magnetic material to approach the magnetic sensor 1. Consequently, the angle (the rotation angle) is measured by the magnetic sensor 1. Here, the angle (the rotation angle) of the crank 580 of the vehicle engine 500 was measured as an example; however, the measuring device 200 may be used for measuring other angles (other rotation angles).

To be used in the measuring device 200 like this, as shown in FIG. 2B, the magnetic sensor 1 magnetically exposes the magnetic poles of the thin film magnet 20 so that the lines of magnetic force are likely to extend from one of the magnetic poles (the north pole or the south pole) of the thin film magnet 20 toward the gear 210. Here, to magnetically expose means that a magnetic pole of the thin film magnet 20 is not covered with a magnetic material that terminates the lines of magnetic force from the other magnetic pole. That is to say, the side surface serving as the magnetic pole of the hard magnetic material layer 103 constituting the thin film magnet 20 is exposed. This is sometimes expressed as a magnetic pole being opened. Note that the side surface of the hard magnetic material layer 103 just has to be magnetically exposed; the side surface may be covered with a nonmagnetic material for protecting the thin film magnet 20 against contamination, corrosion or the like.

Note that, as a magnetic sensor using the magneto-impedance effect, there is a case in which the thin film magnet 20 and the sensitive part 30 are not integrally configured. In this case, it becomes necessary to separately provide a magnet for configuring a magnetic circuit with a magnetic sensor and a facing member (here, the gear 210). In contrast thereto, in the magnetic sensor 1, the thin film magnet 20 is integrally configured, and thereby downsizing is possible.

Moreover, there is a magnetic sensor configured for using the integrated thin film magnet 20 to apply the bias magnetic field (the magnetic field corresponding to the magnetic field Hb in FIG. 3) to the sensitive element 31 of the sensitive part 30. In the magnetic sensor, a portion of each of the yokes 40a and 40b shown in FIG. 2B, which does not face the sensitive part 30 (the outer portion), is extended to the pole (the north pole or the south pole) of the thin film magnet 20. In this case, the lines of magnetic force from one of the poles of the thin film magnet 20 pass through the sensitive part 30 and reach the other pole. In other words, the thin film magnet 20 applies a constant magnetic field to the sensitive part 30. Therefore, it becomes necessary to separately provide a magnet for configuring a magnetic circuit with the magnetic sensor and a facing member (here, the gear 210). In contrast thereto, the magnetic sensor 1 uses the thin film magnet 20 for configuring a magnetic circuit with the facing member, as well as providing the bias magnetic field to the sensitive part 30. Accordingly, in the magnetic sensor 1, members used for the measuring device 200 are reduced, and thereby the measuring device 200 is downsized. Then, in the measuring device 200, assembly, such as setting of positions of the magnetic sensor 1 and the facing member, is made easier.

(Method of Manufacturing Magnetic Sensor 1)

Next, an example of a method of manufacturing the magnetic sensor 1 will be described.

FIGS. 5A to 5E show diagrams illustrating an example of the method of manufacturing the magnetic sensor 1. FIGS. 5A to 5E show respective processes in the method of manufacturing the magnetic sensor 1. Note that FIGS. 5A to 5E show representative processes, and other processes may be included. The processes proceed in the order of FIGS. 5A to 5E. FIGS. 5A to 5E correspond to the cross-sectional view along the IIB-IIB line in FIG. 2A shown in FIG. 2B.

The substrate 10 is, as described above, composed of a non-magnetic material; examples include an oxide substrate, such as glass or sapphire, or a semiconductor substrate, such as silicon. On the substrate 10, for example, streaky grooves or streaky asperities with the radius of curvature Ra of 0.1 nm to 100 nm may be provided by use of a polisher or the like. Note that it is preferable to provide the streaks of the streaky grooves or the streaky asperities in a direction connecting the north pole and the south pole of the thin film magnet 20 configured with the hard magnetic material layer 103. By doing so, the crystal growth in the hard magnetic material layer 103 is promoted in the direction of the grooves. Consequently, the axis of easy magnetization of the thin film magnet 20 configured with the hard magnetic material layer 103 is more likely to face the groove direction (the direction connecting the north pole and the south pole of the thin film magnet 20. In other words, magnetization of the thin film magnet 20 is made easier.

Here, as an example, the substrate 10 will be described as glass having a diameter of about 95 mm and a thickness of about 0.5 mm. In the case where the planar shape of the magnetic sensor 1 is several millimeters square, plural magnetic sensors 1 are collectively manufactured on the substrate 10, and thereafter, divided (cut) into individual magnetic sensors 1. In FIGS. 5A to 5E, attention is focused on one magnetic sensor 1 depicted at the center, and a part of each of the adjacent magnetic sensors 1 on the right and left sides is also shown. Note that the border between the adjacent magnetic sensors 1 is indicated by a long-dot-and-dash line.

Figure 5A:
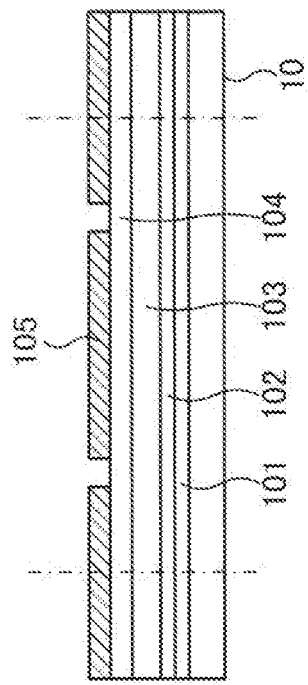
FIGS. 5A to 5E show diagrams illustrating an example of a method of manufacturing the magnetic sensor, where

As shown in FIG. 5A, after washing the substrate 10, on one of the surfaces (hereinafter, referred to as a front surface) of the substrate 10, the adhesive layer 101, the control layer 102, the hard magnetic material layer 103 and the insulating layer 104 are deposited (accumulated) in order, to thereby form a laminated body. Note that the process of forming the laminated body in which the adhesive layer 101, the control layer 102, the hard magnetic material layer 103 and the insulating layer 104 are laminated on the substrate 10 is referred to as a laminated body formation process. In addition, the process of forming the control layer 102 is referred to as a control layer formation process, and the process of forming the hard magnetic material layer 103 is referred to as a hard magnetic material layer formation process.

First, the adhesive layer 101 that is an alloy containing Cr or Ni, the control layer 102 that is an alloy containing Cr and the like, the hard magnetic material layer 103 that is a Co alloy constituting the thin film magnet 20 are continuously deposited (accumulated) in order. The deposition can be performed by a sputtering method or the like. The substrate 10 is moved to face plural targets formed of respective materials in order, and thereby the adhesive layer 101, the control layer 102 and the hard magnetic material layer 103 are laminated on the substrate 10 in order. As described above, in forming the control layer 102 and the hard magnetic material layer 103, the substrate 10 may be heated to, for example, 100° C. to 600° C. for accelerating the crystal growth.

Note that, in deposition of the adhesive layer 101, the substrate 10 may be heated or may not be heated. To remove the moisture and so forth absorbed onto the surface of the substrate 10, the substrate 10 may be heated before the adhesive layer 101 is deposited.

Next, the insulating layer 104, which is oxide, such as $SiO_2$ or $Al_2O_3$, or nitride, such as $Si_2N_4$ or AlN is deposited (accumulated). Deposition of the insulating layer 104 can be performed by a plasma CVD method, a reactive sputtering method or the like.

Figure 5B:
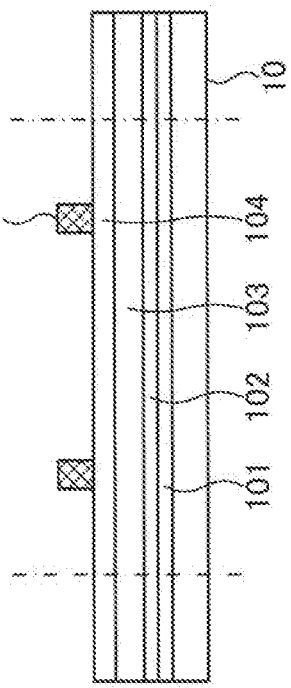

Then, as shown in FIG. 5B, a pattern by photoresist (a resist pattern 111), which has an opening serving as a portion where the sensitive part 30 and the yokes 40 (the yokes 40a and 40b) are formed, is formed by a publicly known photolithography technique.

Figure 5C:
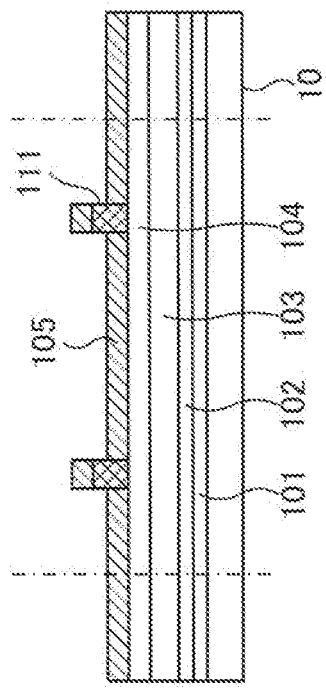

Then, as shown in FIG. 5C, the soft magnetic material layer 105 that is a Co alloy constituting the sensitive element 31 is deposited (accumulated). The deposition of the soft magnetic material layer 105 can be performed by using, for example, the sputtering method. The process of forming the soft magnetic material layer 105 is referred to as a soft magnetic material layer formation process.

Figure 5D:
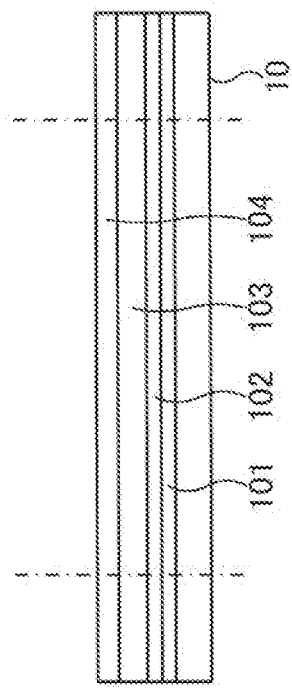

As shown in FIG. 5D, the resist pattern 111 is removed, and the soft magnetic material layer 105 on the resist pattern 111 is also removed (lift-off). Consequently, the sensitive part 30 and the yokes 40 (the yoke 40a and 40b) constituted by the soft magnetic material layer 105 are formed. In other words, the sensitive part 30 and the yokes 40 are formed by a single deposition of the soft magnetic material layer 105. The process of forming the sensitive part 30 is referred to as a sensitive part formation process. Note that the sensitive part formation process may include the soft magnetic material layer formation process and/or a process of forming the yokes 40.

Thereafter, the uniaxial magnetic anisotropy is imparted to the soft magnetic material layer 105 in the width direction of the sensitive elements 31 in the sensitive part 30. The impartation of the uniaxial magnetic anisotropy to the soft magnetic material layer 105 can be performed by heat treatment at 400° C. in a rotating magnetic field of, for example, 3 kG (0.3 T) (heat treatment in the rotating magnetic field) and by heat treatment at 400° C. in a static magnetic field of 3 kG (0.3 T) (heat treatment in the static magnetic field) subsequent thereto. At this time, the soft magnetic material layer 105 constituting the yokes 40 is provided with the similar uniaxial magnetic anisotropy. However, the yokes 40 just have to play a role of a magnetic circuit, and may be provided with the uniaxial magnetic anisotropy.

Next, the hard magnetic material layer 103 constituting the thin film magnet 20 is magnetized. Magnetizing of the hard magnetic material layer 103 can be performed by, in the static magnetic field or in a pulsed magnetic field, continuously applying a magnetic field larger than a coercive force of the hard magnetic material layer 103 until magnetization of the hard magnetic material layer 103 becomes saturated.

Figure 5E:
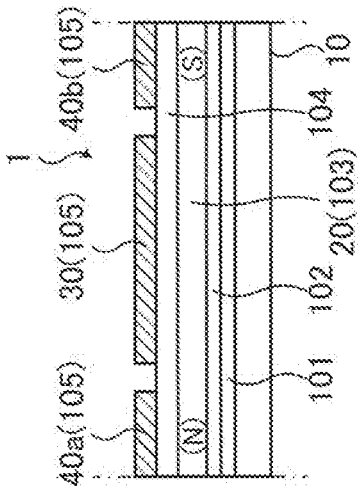

Thereafter, as shown in FIG. 5E, the plural magnetic sensors 1 formed on the substrate 10 is divided (cut) into the individual magnetic sensors 1. In other words, as shown in the plan view of FIG. 2A, the substrate 10, the adhesive layer 101, the control layer 102, the hard magnetic material layer 103, the insulating layer 104 and the soft magnetic material layer 105 are cut to have a quadrangular planar shape. Then, on the side surfaces of the hard magnetic material layer 103 that has been divided (cut), magnetic poles (the north pole and the south pole) of the thin film magnet 20 are exposed. Thus, the magnetized hard magnetic material layer 103 serves as the thin film magnet 20. The division (cutting) can be performed by a dicing method, a laser cutting method or the like. The process of dividing (cutting) the magnetic sensor 1 is referred to as a dividing process. Note that, since the hard magnetic material layer 103 is processed to form the thin film magnet 20 having exposed magnetic poles, the process is referred to as a thin film magnet formation process in some cases.

Note that, before the dividing process in FIG. 5E, the adhesive layer 101, the control layer 102, the hard magnetic material layer 103, the insulating layer 104 and the soft magnetic material layer 105 between the adjacent magnetic sensors 1 on the substrate 10 may be removed by etching so that the planar shape of the magnetic sensor 1 is quadrangular (the planar shape of the magnetic sensor 1 shown in FIG. 2A). Then, the exposed substrate 10 may be divided (cut).

Moreover, after the laminated body formation process in FIC. 5A, the adhesive layer 101, the control layer 102, the hard magnetic material layer 103 and the insulating layer 104 may be processed so that the planar shape of the magnetic sensor 1 is quadrangular (the planar shape of the magnetic sensor 1 shown in FIG. 2A).

Note that the processes in the manufacturing method shown in FIGS. 5A to 5E are simplified as compared to these manufacturing methods.

In this manner, the magnetic sensor 1 is manufactured. Note that impartation of the uniaxial anisotropy to the soft magnetic material layer 105 and/or magnetization of the thin film magnet 20 may be performed on the magnetic sensor 1 or plural magnetic sensors 1 after the dividing (cutting) process in FIG. 5E.

Note that, in the case where the control layer 102 is not provided, it becomes necessary to impart the magnetic anisotropy in a plane by causing the crystal growth by heating the hard magnetic material layer 103 to not less than 800° C. after the hard magnetic material layer 103 was deposited. However, in the case where the control layer 102 is provided as in the magnetic sensor 1 to which the first exemplary embodiment is applied, since the crystal growth is accelerated by the control layer 102, the crystal growth caused by high temperature, such as not less than 800° C., is not required.

In addition, impartation of the uniaxial anisotropy to the sensitive element 31 of the sensitive part 30 may be performed in depositing the soft magnetic material layer 105, which is a Co alloy constituting the sensitive element 31, by use of a magnetron sputtering method, instead of being performed in the above-described heat treatment in the rotating magnetic field and heat treatment in the static magnetic field. In the magnetron sputtering method, a magnetic field is formed by using magnets and electrons generated by discharge are enclosed (concentrated) on a surface of a target. This increases collision probability of electrons and gases to accelerate ionization of gases, to thereby improve deposition rate of a film. By the magnetic field formed by the magnets used in the magnetron sputtering method, the soft magnetic material layer 105 is deposited, and at the same time, the uniaxial anisotropy is imparted to the soft magnetic material layer 105. By doing so, it is possible to omit the process of imparting the uniaxial anisotropy in the heat treatment in the rotating magnetic field and the heat treatment in the static magnetic field.

Next, a modified example of the magnetic sensor 1 will be described.

(Magnetic Sensor 2)

In the magnetic sensor 1 shown in FIGS. 2A and 2B, the sensitive part 30 was configured with a single layer of the soft magnetic material layer 105. In a magnetic sensor 2, which is a modified example of the magnetic sensor 1, the sensitive part 30 is configured with two soft magnetic material layers provided with a demagnetizing field suppressing layer interposed therebetween.

Figure 6A:
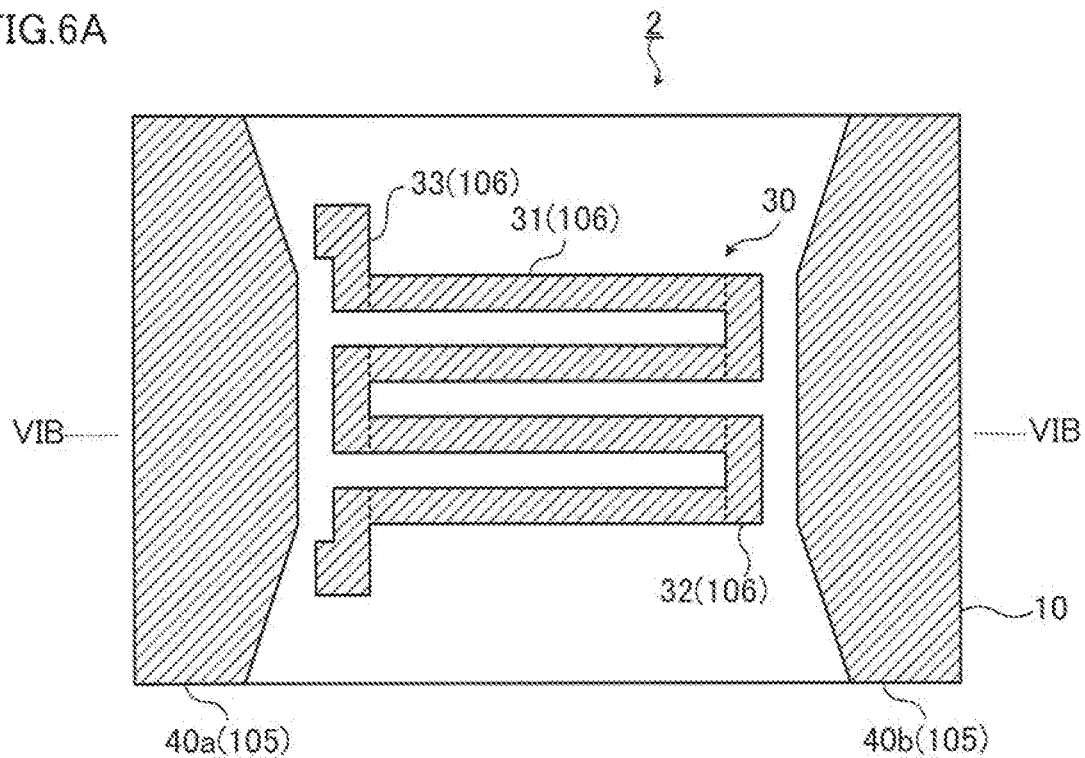
FIGS. 6A and 6B show diagrams illustrating an example of a magnetic sensor, which is a modified example, where
Figure 6B:
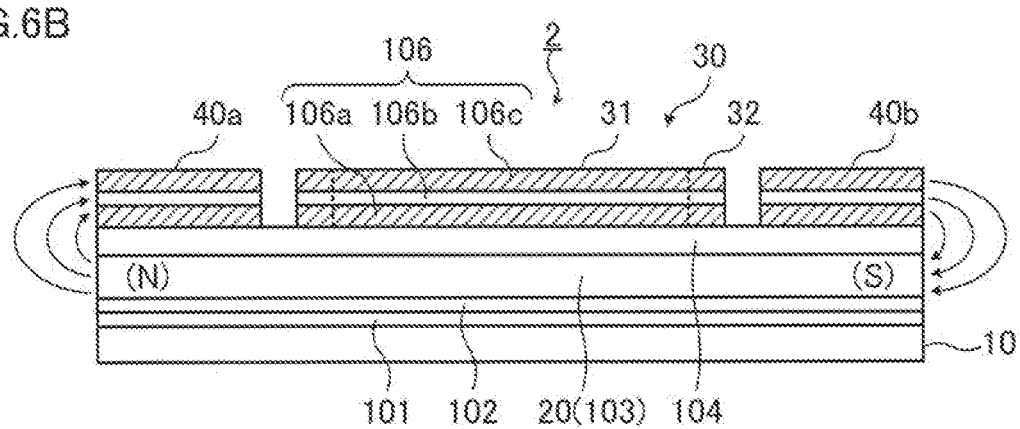

FIGS. 6A and 6B show diagrams illustrating an example of the magnetic sensor 2, which is a modified example. FIG. 6A is a plan view and FIG. 6B is a cross-sectional view along the VIB-VIB line in FIG. 6A. Hereinafter, portions different from those of the magnetic sensor 1 will be mainly described, and similar portions will be assigned with same reference signs to thereby omit descriptions thereof.

As shown in FIG. 6B, in the magnetic sensor 2, a magnetic material layer 106 includes a lower soft magnetic material layer 106a on a lower layer (the substrate 10) side, a demagnetizing field suppressing layer 106b and an upper soft magnetic material layer 106c on an upper layer (opposite to the substrate 10) side. In other words, the lower soft magnetic material layer 106a and the upper soft magnetic material layer 106c are provided with the demagnetizing field suppressing layer 106b interposed therebetween.

For the lower soft magnetic material layer 106a and the upper soft magnetic material layer 106c, similar to the soft magnetic material layer 105 in the magnetic sensor 1, the Co alloy constituting the sensitive part 31 can be used. For the demagnetizing field suppressing layer 106b, Ru or an Ru alloy can be used.

Here, the thickness of the demagnetizing field suppressing layer 106b made of Ru or the Ru alloy ranging from 0.4 nm to 1.0 nm or from 1.6 nm to 2.6 nm provides an AntiFerromagnetically-Coupled (AFC) structure to the lower soft magnetic material layer 106a and the upper soft magnetic material layer 106c. In other words, the demagnetizing field is suppressed, and thereby sensitivity of the sensitive element 31 is improved.

For the magnetic sensor 2, in the soft magnetic material layer deposition process shown in FIG. 5C, magnetic material layer 106 may be deposited (accumulated) instead of depositing (accumulating) the soft magnetic material layer 105. In other words, the lower soft magnetic material layer 106a, the demagnetizing field suppressing layer 106b and the upper soft magnetic material layer 106c may be continuously deposited (accumulated) in this order in place of the soft magnetic material layer 105. The deposition (accumulation) can be performed by the sputtering method.

(Magnetic Sensor 3)

In the magnetic sensor 1 shown in FIGS. 2A and 2B, the connection part 32 and the terminal part 33 of the sensitive part 30 were configured with the soft magnetic material layer 105, which was same as the sensitive element 31. In a magnetic sensor 3, which is another modified example of the magnetic sensor 1, the connection part 32 and the terminal part 33 of the magnetic sensor 1 are configured with a nonmagnetic conductive material (a conductor layer).

Figure 7A:
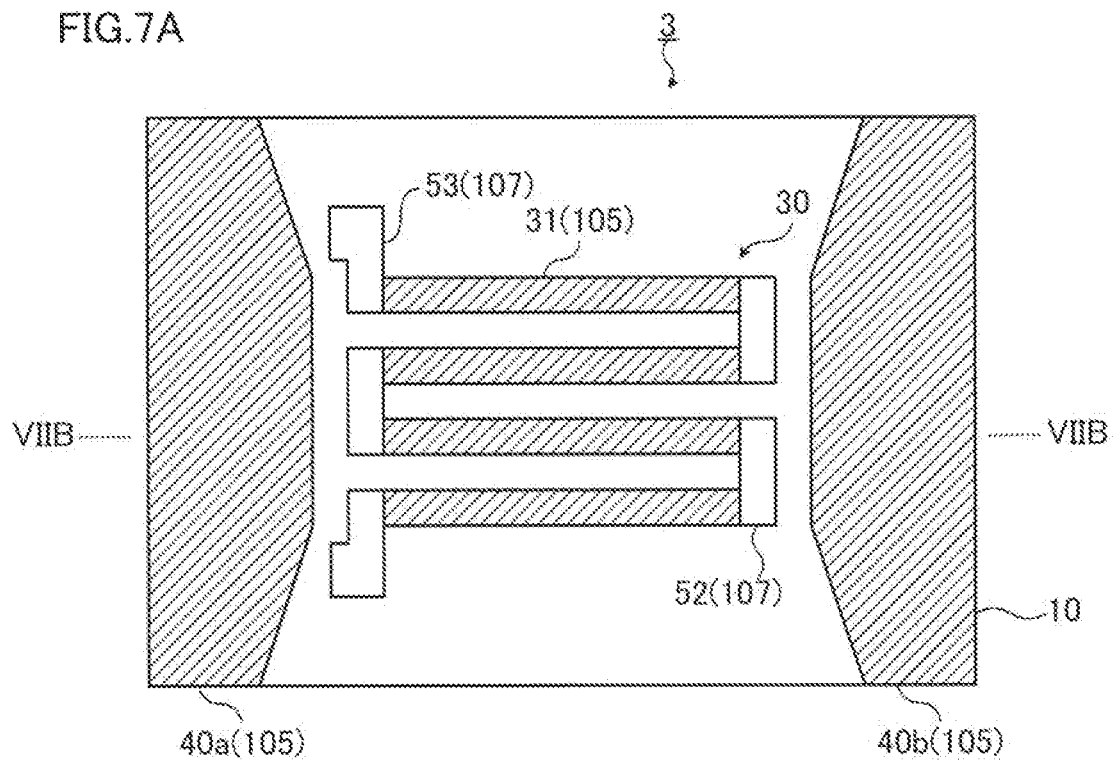
FIGS. 7A and 7B show diagrams illustrating an example of another magnetic sensor, which is also a modified example, where
Figure 7B:
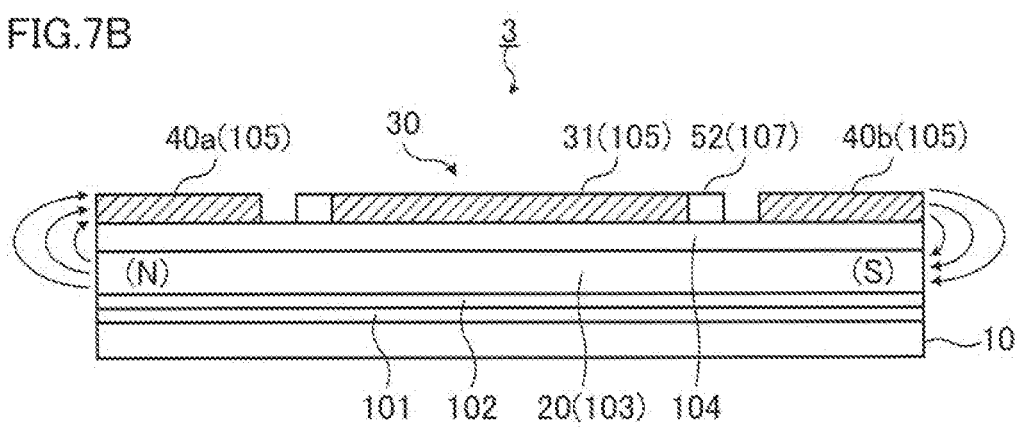

FIGS. 7A and 7B show diagrams illustrating an example of the magnetic sensor 3 that is the modified example. FIG. 7A is a plan view and FIG. 7B is a cross-sectional view along the VIIB-VIIB line in FIG. 7A. Hereinafter, portions different from those of the magnetic sensor 1 will be mainly described, and similar portions will be assigned with same reference signs to thereby omit descriptions thereof.

As shown in FIG. 7A, the sensitive part 30 of the magnetic sensor 3 includes, in place of the connection parts 32, connection conductive parts 52 each configured with the nonmagnetic conductor layer 107 and, in place of the terminal parts 33, terminal conductive parts 53 each similarly configured with the nonmagnetic conductor layer 107.

The nonmagnetic conductor layer 107 constituting the connection conductive part 52 and the terminal conductive part 53 may be made of a material with excellent conductivity, and, for example, Cu, Au or Al can be used.

In the magnetic sensor 1 shown in FIGS. 2A and 2B, since the connection part 32 and the terminal part 33 are configured with the soft magnetic material layer 105, the magneto-impedance effect is generated also in the connection part 32 and the terminal part 33. However, the magnetic sensor 3 uses the connection conductive part 52 and the terminal conductive part 53 configured with the nonmagnetic conductor layer 107; therefore, the magnetic field by the magneto-impedance effect caused only by the sensitive element 31 is detected. Accordingly, only the magneto-impedance effect in the direction of the magnetic field to be detected is extracted, and thereby the detection sensitivity is improved.

In addition, by using the terminal conductive part 53, it becomes easy to connect the electric wire for supplying the electrical current to the sensitive part 30.

Deposition (accumulation) of the nonmagnetic conductor layer 107 constituting the connection conductive part 52 and the terminal conductive part 53 can be performed by, for example, the sputtering method, the vacuum deposition method or the like using a metal mask. In other words, after the sensitive part formation process in FIG. 5D, the conductor layer 107 may be deposited (accumulated) through a metal mask in which regions of the connection conductive part 52 and the terminal conductive part 53 are opened.

Alternatively, the connection conductive part 52 and the terminal conductive part 53 may be formed by a lift-off method using a photoresist. In other words, subsequent to the sensitive part formation process in FIG. 5D, it may be possible that a resist pattern in which the regions for forming the connection conductive part 52 and the terminal conductive part 53 are opened is formed, and thereafter, the conductor layer 107 is deposited (accumulated) and the resist pattern is removed.

Note that the connection conductive part 52 may be provided to connect the sensitive elements 31 without providing the connection part 32 as shown in FIGS. 7A and 7B, or may be provided to be placed on the connection part 32 configured with the soft magnetic material layer 105. This holds true for the terminal conductive part 53, too.

In addition, in the case where the terminal conductive part 53, in particular, the pad part thereof is desired to be thicker than the connection conductive part 52, the connection conductive part 52 and the terminal conductive part 53 or the pad part of the terminal conductive part 53 may be formed in separate processes.

Though illustration is omitted, in the magnetic sensor 2 shown in FIGS. 6A and 6B, the connection conductive part 52 and the terminal conductive part 53 may be used in place of the connection part 32 and the terminal part 33, or may be used to be placed on the connection part 32 and the terminal part 33, respectively.

(Magnetic Sensor 4)

In the magnetic sensor 1 shown in FIGS. 2A and 2B, as well as the north pole of the thin film magnet 20 facing the gear 210, the south pole was also in the state of being magnetically exposed. Consequently, after passing through the gear 210 from the north pole, the lines of magnetic force are divided into those passing through the sensitive elements 31 of the sensitive part 30 and returning to the south pole and those returning to the south pole without passing through the sensitive elements 31. If the lines of magnetic force passing through the sensitive elements 31 are few, the magnetic field (corresponding to the magnetic field Hb in FIG. 3) applied to the sensitive elements 31 by the thin film magnet 20 is reduced. For this reason, it is necessary to thicken the thin film magnet 20 to apply a determined magnetic field to the sensitive elements 31.

Therefore, in a magnetic sensor 4, which is a modified example of the magnetic sensor 1, in order that the other one of the magnetic poles of the thin film magnet 20, which is opposite to one of the magnetic poles facing the gear 210, is not magnetically exposed, a yoke is provided between the other magnetic pole of the thin film magnet 20 and the sensitive elements 31 of the sensitive part 30.

Figure 8A:
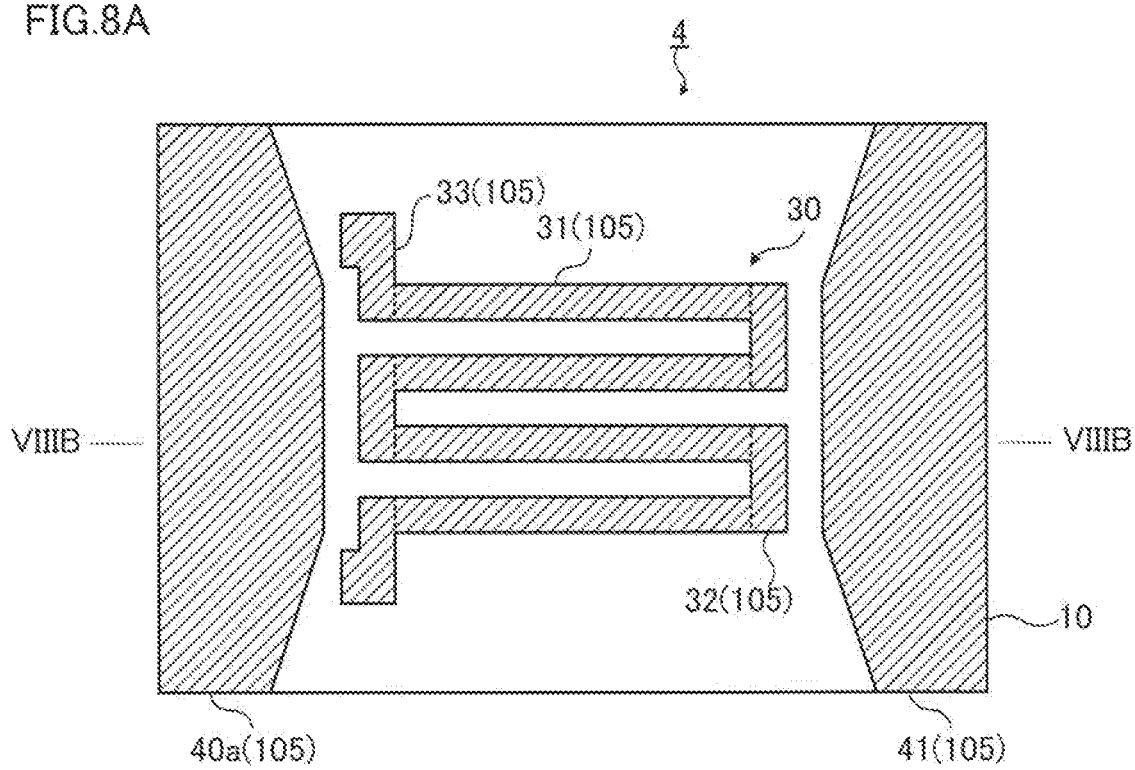
FIGS. 8A and 8B show diagrams illustrating an example of still another magnetic sensor, which is also a modified example, where
Figure 8B:
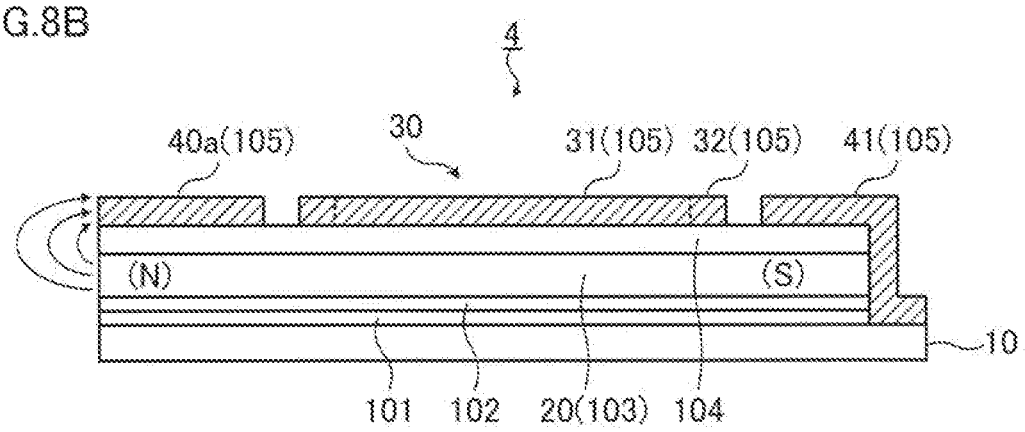

FIGS. 8A and 8B show diagrams illustrating an example of the magnetic sensor 4 that is the modified example. FIG. 8A is a plan view and FIG. 8B is a cross-sectional view along the VIIIB-VIIIB line in FIG. 8A. Hereinafter, portions different from those of the magnetic sensor 1 will be mainly described, and similar portions will be assigned with same reference signs to thereby omit descriptions thereof.

Here, provision of a yoke 41 between the other magnetic pole (here, assumed to be the south pole) of the thin film magnet 20 and the sensitive elements 31 of the sensitive part 30 increases, of the lines of magnetic force returning to the south pole, the lines of magnetic force passing through the sensitive elements 31. Consequently, magnetization (the magnetic force) of the thin film magnet 20 can be effectively used, and thereby the thin film magnet 20 can be thinner.

(Method of Manufacturing Magnetic Sensor 4)

FIGS. 9A to 9G show diagrams illustrating an example of a method of manufacturing the still other magnetic sensor 4, which is the modified example. FIGS. 9A to 9G show respective processes in the method of manufacturing the magnetic sensor 4. Note that FIGS. 9A to 9G show the representative processes, and other processes may be included. The processes proceed in the order of FIGS. 9A to 9G. FIGS. 9A to 9G correspond to the cross-sectional view along the VIIIB-VIIIB line in FIG. 8A shown in FIG. 8B.

As shown in FIG. 9A, after washing the substrate 10, a resist pattern 112 is formed on a portion, on which the magnetic pole that is not exposed is formed, of one of the surfaces (hereinafter, referred to as a front surface) of the substrate 10. Here, in the two adjacent magnetic sensor 4, the facing magnetic pole is set as the magnetic pole that is not exposed. In other words, in the magnetic sensor 4 shown at the center of FIG. 9F, the south pole is the magnetic pole that is not exposed and the north pole is the exposed magnetic pole; however, in the magnetic sensor 4 that is adjacent on the right side indicated by the broken line, the north pole is the magnetic pole that is not exposed and the south pole is the exposed magnetic pole. Moreover, the magnetic sensor 4 adjacent on the left side is similar to the magnetic sensor 4 adjacent on the right side.

Next, as shown in FIG. 9B, on the front surface of the substrate 10 where the resist pattern 112 has been formed, the adhesive layer 101, the control layer 102, the hard magnetic material layer 103 and the insulating layer 104 are deposited (accumulated) in order. The process is similar to the laminated body formation process in FIG. 5A.

Then, as shown in FIG. 9C, the resist pattern 112 is removed, and the adhesive layer 101, the control layer 102, the hard magnetic material layer 103 and the insulating layer 104 deposited on the resist pattern 112 are also removed (lift-off).

Next, as shown in FIG. 9D, a resist pattern 113, which has openings serving as the portions where the sensitive part 30, the yoke 40a and the yoke 41 are formed, is formed. The process is similar to FIG. 5B.

Then, as shown in FIG. 9E, the soft magnetic material layer 105 that is the Co alloy constituting the sensitive element 31 is deposited (accumulated). The process is similar to the soft magnetic material layer formation process in FIG. 5C.

As shown in FIG. 9F, the resist pattern 113 is removed, and the soft magnetic material layer 105 on the resist pattern 113 is also removed (lift-off). The process is similar to the sensitive part formation process in FIG. 5D. Consequently, the sensitive part 30, the yoke 40a and the yoke 41 constituted by the soft magnetic material layer 105 are formed.

Thereafter, similar to the magnetic sensor 1, impartation of the uniaxial magnetic anisotropy to the soft magnetic material layer 105 and magnetization of the hard magnetic material layer 103 are performed. Thereafter, as shown in FIG. 9G, division (cutting) into the individual magnetic sensors 4 is performed. FIG. 9G is similar to the dividing process (the thin film magnet formation process) in FIG. 5E.

In the magnetic sensor 4, though the manufacturing process is complicated as compared to the magnetic sensor 1, one of the magnetic poles of the thin film magnet 20 is not exposed. Note that the magnetic sensor 4 may be manufactured by use of any other manufacturing process.

Second Exemplary Embodiment

The measuring device 200 shown in FIG. 1, to which the first exemplary embodiment is applied, measured the angle (the rotation angle). A measuring device 300 to which a second exemplary embodiment is applied measures a position. Here, as an example of measuring a position, an XY stage setting a position of a load with accuracy will be described.

FIGS. 10A and 10B show diagrams illustrating an XY stage 600 by use of an example of the measuring device 300 to which the second exemplary embodiment is applied, where FIG. 10A is a plan view and FIG. 10B is a side elevational view. As shown in FIG. 10A, it is assumed that the lateral direction is the X direction, and the vertical direction is Y direction.

As shown in FIG. 10A, the XY stage 600 includes: a stage 610 capable of moving in an X direction and in a Y direction; a Y-direction support base 620 moving the stage 610 in the Y direction while holding the stage 610 from below; an X-direction support base 630 moving the Y-direction support base 620 in the X direction while holding the Y-direction support base 620 from below; and a control part 640 controlling the position of the stage 610 in the X direction and Y direction.

For example, the stage 610 is held on a rail (not shown) by ball bearings (indicated by circles), the rail being provided in the Y direction on the Y-direction support base 620. Consequently, the stage 610 can move in the Y direction on the Y-direction support base 620. Moreover, the Y-direction support base 620 is held on a rail (not shown) by ball bearings (indicated by circles), the rail being provided in the X direction on the X-direction support base 630. Consequently, the Y-direction support base 620 can move in the X direction on the X-direction support base 630. The X-direction support base 630 is fastened. By these, the stage 610 can move in the X direction and the Y direction with respect to the X-direction support base 630.

The XY stage 600 includes: a measuring device 300a measuring a position of the stage 610 in the X direction; and a measuring device 300b measuring a position of the stage 610 in the Y direction. When the measuring devices 300a and 300b are not distinguished, these are referred to as a measuring device 300.

The measuring device 300a includes a magnetic sensor 1a and a linear multipole magnet 310a, and the measuring device 300b includes a magnetic sensor 1b and a linear multipole magnet 310b. The magnetic sensors 1a and 1b are the magnetic sensor 1 described in the first exemplary embodiment. Accordingly, when the magnetic sensors 1a and 1b are not distinguished, these are referred to as the magnetic sensor 1. In addition, the linear multipole magnets 310a and 310b have the same configuration. Accordingly, when the linear multipole magnets 310a and 310b are not distinguished, these are referred to as a linear multipole magnet 310. The linear multipole magnet 310 (the linear multipole magnets 310a and 310b) is another example of the facing member.

The magnetic sensor 1a is fastened to a back surface of the Y-direction support base 620. The linear multipole magnet 310a is fastened to an end portion in the X direction of the X-direction support base 630. Note that the magnetic sensor 1a is set to face the linear multipole magnet 310a with a defined distance while the Y-direction support base 620 is moved in the X direction. Note that the magnetic sensor 1a may be provided to the front surface or the side surface of the Y-direction support base 620.

Similarly, the magnetic sensor 1b is fastened to a back surface of the stage 610. The linear multipole magnet 310b is fastened to an end portion in the Y direction of the Y-direction support base 620. Note that the magnetic sensor 1b is set to face the linear multipole magnet 310b with a defined distance while the stage 610 is moved in the Y direction. In addition, the magnetic sensor 1b may be provided to the front surface or the side surface of the stage 610.

Based on the position of the Y-direction support base 620 in the X direction that has been measured by the magnetic sensor 1a and the position of the stage 610 in the Y direction that has been measured by the magnetic sensor 1b, the control part 640 moves the stage 610 in the Y direction and the Y-direction support base 620 in the X direction so that the stage 610 is moved to the defined positions in the X direction and in the Y direction. Consequently, the position of the load placed on the stage 610 is set. Note that, in FIGS. 10A and 10B, the moving mechanism moving the stage 610 in the Y direction and the moving mechanism moving the Y-direction support base 620 in the X direction are publicly known; therefore, description thereof is omitted.

Next, description will be given of a measuring method of the position by the measuring device 300.

Figure 11:
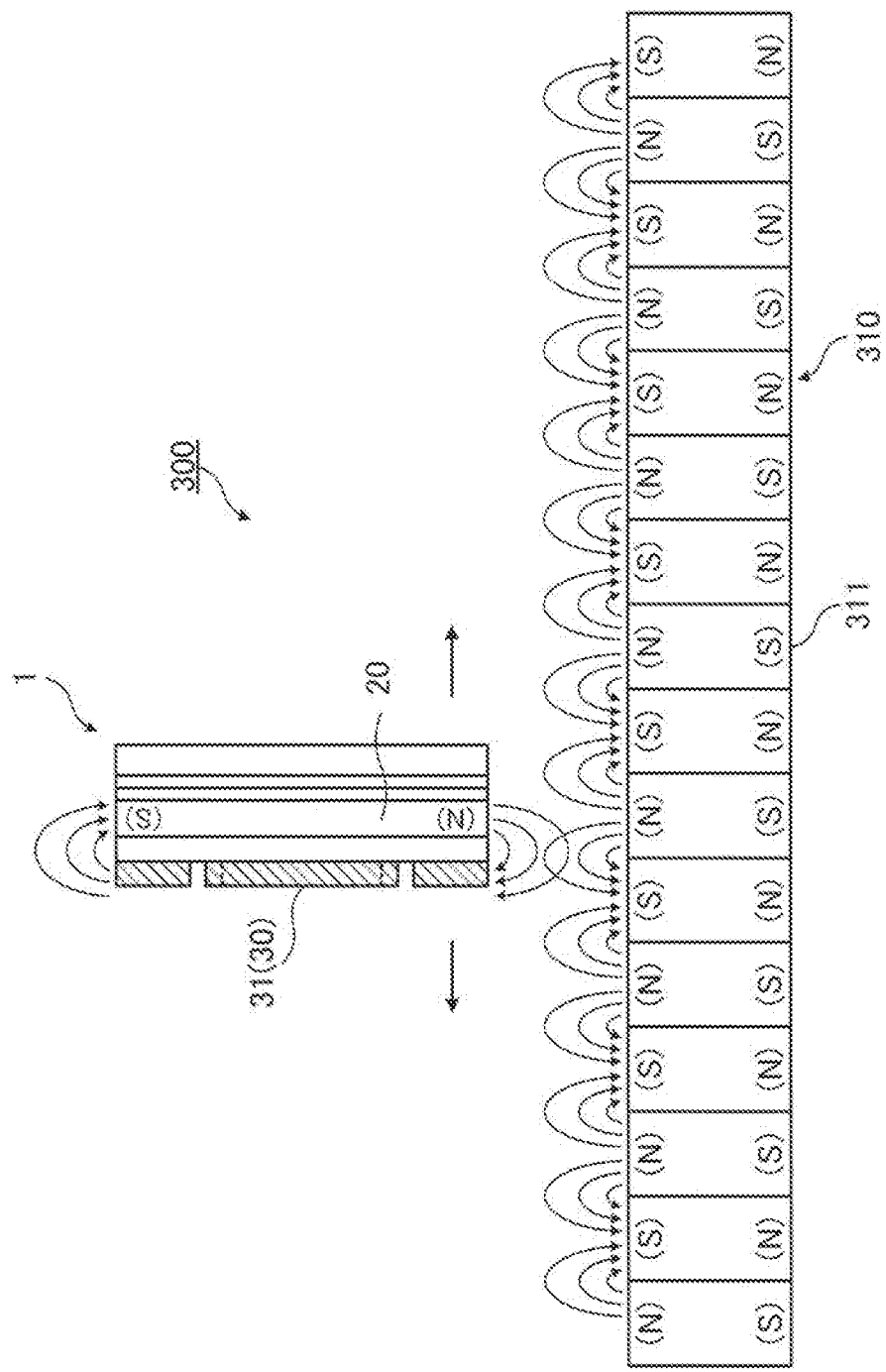
FIG. 11 shows a diagram illustrating a measuring method of a position by the measuring device to which the second exemplary embodiment is applied.

FIG. 11 shows a diagram illustrating a measuring method of the position by the measuring device 300 to which the second exemplary embodiment is applied.

The linear multipole magnet 310 is configured by alternately arranging the exposed north pole and south pole of the plural magnets 311 in a line. Then, one of the poles of the linear multipole magnet 310 is disposed to approach and face one of the poles (in FIG. 11, the north pole) of the thin film magnet 20 in the magnetic sensor 1. With the movement of the magnetic sensor 1, one of the poles (the north pole) of the thin film magnet 20 moves along the arrangement of one of the poles of the linear multipole magnet 310. In other words, one of the poles (the north pole) of the thin film magnet 20 in the magnetic sensor 1 alternately approaches the north pole and the south pole of the linear multipole magnet 310. Consequently, for example, in the case where one of the poles of the thin film magnet 20 is the north pole, when the pole approaches the north pole of the linear multipole magnet 310, the lines of magnetic force from the north pole of the thin film magnet 20 and the lines of magnetic force from the north pole of the linear multipole magnet 310 overlap and pass through the sensitive elements 31 of the magnetic sensor 1. On the other hand, when the pole approaches the south pole of the linear multipole magnet 310, the lines of magnetic force from the north pole of the thin film magnet 20, from which the lines of magnetic force toward the south pole of the linear multipole magnet 310 are subtracted, pass through the sensitive elements 31 of the magnetic sensor 1. Accordingly, in the case where the pole approaches the north pole of the linear multipole magnet 310, the impedance Z of the sensitive part 30 is increased as compared to the case where the pole approaches the south pole of the linear multipole magnet 310 (refer to FIG. 3).

Thus, the pulsed signal of the impedance Z with respect to the time t as shown in FIG. 4B can be obtained. Then, by setting the origin in advance, the positions of the stage 610 in the X direction and in the Y direction can be measured.

Here, description has been given with the magnetic sensor 1 to which the first exemplary embodiment is applied; however, in place of the magnetic sensor 1, the magnetic sensor 2 to the magnetic sensor 4, which are the modified examples of the magnetic sensor 1, may be used.

Moreover, in the measuring device 300 to which the second exemplary embodiment is applied, the linear multipole magnet 310 in which the north pole and the south pole are alternately arranged in a line was used. In place of the linear multipole magnet 310, similar to the gear 210 of the measuring device 200 to which the first exemplary embodiment is applied, a member arranging asperities configured with the magnetic material (for example, the soft magnetic material) in a line may be used.

To the contrary, in the measuring device 200 to which the first exemplary embodiment is applied, similar to the linear multipole magnet 310 in the second exemplary embodiment, a rotor multipole magnet alternately arranging the north pole and the south pole in the circumferential direction may be used in place of the gear 210.

In the above, description has been given of the measurement of the angle in the first exemplary embodiment, and the measurement of the position in the second exemplary embodiment; however, any measuring device measuring relative movement with respect to the facing member can be applied to measurement of objects other than the angle or position. Then, unless contrary to the gist of the present invention, various modifications and combinations may be performed.

REFERENCE SIGNS LIST 1, 2, 3, 4 Magnetic sensor
10 Substrate
20 Thin film magnet
30 Sensitive part
31 Sensitive element
32 Connection part
33 Terminal part
40, 40a, 40b, 41 Yoke
52 Connection conductive part 53 Terminal conductive part
101 Adhesive layer
102 Control layer
103 Hard magnetic material layer
104 Insulating layer
105 Soft magnetic material layer
106 Magnetic material layer
106a Lower soft magnetic material layer
106b Demagnetizing field suppressing layer
106c Upper soft magnetic material layer
107 Conductor layer
111, 112, 113 Resist pattern
200, 300, 300a, 300b Measuring device
210 Gear
210a Teeth part
210b Non-teeth part
211 Teeth
310, 310a, 310b Linear multipole magnet
500 Vehicle engine
600 XY stage
H Magnetic field
Z Impedance

The invention claimed is:

1. A magnetic sensor comprising:
a thin film magnet configured with a hard magnetic material layer and having magnetic anisotropy in an in-plane direction; and
a sensitive part comprising a sensitive element configured to sense a magnetic field by a magneto-impedance effect,
wherein the sensitive element is configured with a soft magnetic material layer laminated on the hard magnetic material layer, having a longitudinal direction and a short direction and having uniaxial magnetic anisotropy in a direction intersecting the longitudinal direction, the longitudinal direction facing in a direction of a magnetic field generated by the thin film magnet,
wherein the thin film magnet and the sensitive element comprise a magnetic circuit with a facing member provided outside to face one of magnetic poles of the thin film magnet,
wherein the magnetic sensor further comprises a control layer between a nonmagnetic substrate and the hard magnetic material layer, and
wherein the control layer is configured to control the magnetic anisotropy of the hard magnetic material layer in the in-plane direction.

2. The magnetic sensor according to claim 1, wherein the magnetic pole of the thin film magnet facing the facing member is magnetically exposed toward the facing member.

3. The magnetic sensor according to claim 1, wherein the sensitive element of the sensitive part is configured with a plurality of soft magnetic material layers, the soft magnetic material layers being antiferromagnetically-coupled with a demagnetizing field suppressing layer made of Ru or an Ru alloy interposed therebetween.

4. The magnetic sensor according to claim 2, wherein the sensitive element of the sensitive part is configured with a plurality of soft magnetic material layers, the soft magnetic material layers being antiferromagnetically-coupled with a demagnetizing field suppressing layer made of Ru or an Ru alloy interposed therebetween.

5. A measuring device comprising:
a magnetic sensor comprising:
a thin film magnet configured with a hard magnetic material layer and having magnetic anisotropy in an in-plane direction; and
a sensitive part comprising a sensitive element configured to sense a magnetic field by a magneto-impedance effect,
wherein the sensitive element is configured with a soft magnetic material layer laminated on the hard magnetic material layer, having a longitudinal direction and a short direction and having uniaxial magnetic anisotropy in a direction intersecting the longitudinal direction, the longitudinal direction facing in a direction of a magnetic field generated by the thin film magnet; and
a facing member facing one of magnetic poles of the thin film magnet of the magnetic sensor, the facing member comprising a magnetic circuit with the thin film magnet and the sensitive element,
wherein the sensitive element is configured to measure a variation in the magnetic field caused by relative movement of the facing member with respect to the magnetic sensor,
wherein the magnetic sensor further comprises a control layer between a nonmagnetic substrate and the hard magnetic material layer, and
wherein the control layer is configured to control the magnetic anisotropy of the hard magnetic material layer in the in-plane direction.

6. A method of manufacturing a magnetic sensor, the method comprising:
a hard magnetic material layer formation process comprising forming a hard magnetic material layer comprising a thin film magnet on a nonmagnetic substrate, magnetic anisotropy of the thin film magnet being controlled in an in-plane direction;
a sensitive part formation process comprising laminating a soft magnetic material layer on the hard magnetic material layer to form a sensitive part including a sensitive element having uniaxial magnetic anisotropy in a direction intersecting a direction of a magnetic field generated by the thin film magnet and sensing a magnetic field by a magneto-impedance effect;
a thin film magnet processing process comprising processing the hard magnetic material layer into the thin film magnet to cause one of magnetic poles of the thin film magnet to be magnetically exposed toward a facing member provided outside to face the one of the magnetic poles of the thin film magnet; and
a control layer formation process comprising forming a control layer between the nonmagnetic substrate and the hard magnetic material layer, the control layer controlling the magnetic anisotropy of the hard magnetic material layer in an in-plane direction.

* * * * *